(12) United States Patent
Baek

(10) Patent No.: US 11,063,097 B2
(45) Date of Patent: Jul. 13, 2021

(54) TRANSPARENT DISPLAY DEVICE

(71) Applicant: LG Display Co., Ltd., Seoul (KR)

(72) Inventor: Heume-Il Baek, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 16/524,641

(22) Filed: Jul. 29, 2019

(65) Prior Publication Data

US 2020/0176530 A1 Jun. 4, 2020

(30) Foreign Application Priority Data

Dec. 3, 2018 (KR) ........................ 10-2018-0153734

(51) Int. Cl.
| | |
|---|---|
| *H01L 27/32* | (2006.01) |
| *H01L 51/50* | (2006.01) |
| *H01L 27/15* | (2006.01) |
| *H01L 51/00* | (2006.01) |
| *H01L 33/60* | (2010.01) |

(52) U.S. Cl.
CPC .......... *H01L 27/3246* (2013.01); *H01L 27/15* (2013.01); *H01L 27/156* (2013.01); *H01L 27/3216* (2013.01); *H01L 51/0032* (2013.01); *H01L 51/50* (2013.01); *B32B 2457/206* (2013.01); *G09G 2300/0465* (2013.01); *H01L 33/60* (2013.01); *H01L 2251/568* (2013.01)

(58) Field of Classification Search
CPC .... G09G 2300/0465; H01L 27/15–156; H01L 27/3225–3234; H01L 51/0032–0095; H01L 51/50–56; H01L 33/58–60; H01L 27/32–3297; H01L 2251/50–568; B32B 2457/206

See application file for complete search history.

(56) References Cited

U.S. PATENT DOCUMENTS

| | | | | |
|---|---|---|---|---|
| 5,795,804 A | * | 8/1998 | Jenq | .................. H01L 27/10817 257/E21.648 |
| 6,214,697 B1 | * | 4/2001 | Moore | .............. H01L 21/76224 257/E21.546 |
| 6,596,598 B1 | * | 7/2003 | Krivokapic | ....... H01L 21/26586 257/E21.205 |

(Continued)

FOREIGN PATENT DOCUMENTS

| | | |
|---|---|---|
| KR | 10-1084240 B1 | 11/2011 |
| KR | 10-2013-0071543 A | 7/2013 |
| KR | 10-2018-0061777 A | 6/2018 |

*Primary Examiner* — Maliheh Malek
(74) *Attorney, Agent, or Firm* — Morgan, Lewis & Bockius LLP

(57) ABSTRACT

A transparent display device includes: a substrate including an emission area and a first transparent area; first, second, and third pixel regions on the substrate and including the emission area and the first transparent area; a first bank on the substrate; a first opening surrounded by the first bank and corresponding to the first pixel region; a second opening surrounded by the first bank and corresponding to the second pixel region; a third opening surrounded by the first bank and corresponding to the third pixel region; a plurality of second banks overlapping at least one of the first, second, and third openings, and overlapping the first bank; and a light-emitting diode on the first, second, and third openings on the substrate.

23 Claims, 12 Drawing Sheets

(56) References Cited

U.S. PATENT DOCUMENTS

| | | | | |
|---|---|---|---|---|
| 7,037,994 B2* | 5/2006 | Sugita | C07C 33/38 | 430/271.1 |
| 7,244,549 B2* | 7/2007 | Iwasawa | G03F 7/0045 | 430/270.1 |
| 7,303,855 B2* | 12/2007 | Hatakeyama | G03F 7/091 | 430/270.1 |
| 7,358,025 B2* | 4/2008 | Hatakeyama | G03F 7/091 | 430/156 |
| 7,402,467 B1* | 7/2008 | Kadono | H01L 27/1214 | 438/151 |
| 8,436,404 B2* | 5/2013 | Bohr | H01L 21/76802 | 257/288 |
| 8,530,910 B2* | 9/2013 | Song | H01L 27/326 | 257/88 |
| 8,816,331 B2* | 8/2014 | Choi | H01L 27/326 | 257/40 |
| 9,276,013 B1* | 3/2016 | Doris | H01L 29/16 | |
| 10,026,824 B1* | 7/2018 | Chanemougame | H01L 29/785 | |
| 10,325,819 B1* | 6/2019 | Gao | H01L 21/823878 | |
| 10,446,616 B2* | 10/2019 | Kim | H01L 27/3276 | |
| 10,741,788 B2* | 8/2020 | Won | H01L 51/5256 | |
| 2002/0179908 A1* | 12/2002 | Arao | H01L 27/088 | 257/72 |
| 2006/0276096 A1* | 12/2006 | Wang | H01L 27/3246 | 445/2 |
| 2007/0173002 A1* | 7/2007 | Hall | H01L 29/42376 | 438/184 |
| 2008/0296623 A1* | 12/2008 | Wilhelm | H01L 29/66242 | 257/197 |
| 2009/0058283 A1* | 3/2009 | Tanaka | H01L 51/5218 | 313/504 |
| 2011/0147770 A1* | 6/2011 | Hwang | H01L 27/326 | 257/89 |
| 2012/0080680 A1* | 4/2012 | Choi | H01L 27/3218 | 257/59 |
| 2012/0267611 A1* | 10/2012 | Chung | H01L 27/3272 | 257/40 |
| 2013/0161656 A1* | 6/2013 | Choi | H01L 51/5253 | 257/88 |
| 2013/0194205 A1* | 8/2013 | Park | G06F 3/0445 | 345/173 |
| 2014/0117421 A1* | 5/2014 | Seo | H01L 21/823814 | 257/288 |
| 2014/0183479 A1* | 7/2014 | Park | H01L 27/3218 | 257/40 |
| 2014/0264482 A1* | 9/2014 | Li | H01L 21/76816 | 257/288 |
| 2015/0009436 A1* | 1/2015 | Kim | G02F 1/13725 | 349/33 |
| 2015/0054719 A1* | 2/2015 | Lee | H01L 27/326 | 345/76 |
| 2015/0144910 A1* | 5/2015 | Beak | H01L 27/1255 | 257/40 |
| 2015/0243884 A1* | 8/2015 | BrightSky | H01L 45/1683 | 257/4 |
| 2015/0332963 A1* | 11/2015 | Wu | H01L 21/76804 | 438/668 |
| 2016/0035857 A1* | 2/2016 | Leobandung | H01L 29/665 | 257/288 |
| 2016/0118451 A1* | 4/2016 | Youn | H01L 27/3262 | 257/40 |
| 2016/0126295 A1* | 5/2016 | Sato | H01L 27/3213 | 257/89 |
| 2016/0141417 A1* | 5/2016 | Park | H01L 21/76831 | 257/365 |
| 2016/0188061 A1* | 6/2016 | Cho | G06F 3/0446 | 345/173 |
| 2016/0321982 A1* | 11/2016 | Lee | G09G 3/3233 | |
| 2016/0329406 A1* | 11/2016 | Fu | H01L 21/76897 | |
| 2017/0053972 A1* | 2/2017 | Kim | H01L 27/326 | |
| 2017/0062535 A1* | 3/2017 | Kim | H01L 27/3246 | |
| 2017/0125506 A1* | 5/2017 | Kim | H01L 27/3265 | |
| 2017/0154848 A1* | 6/2017 | Fan | H01L 21/76805 | |
| 2017/0194203 A1* | 7/2017 | Hung | H01L 27/1104 | |
| 2017/0194390 A1* | 7/2017 | Kim | H01L 27/3276 | |
| 2017/0345759 A1* | 11/2017 | Lin | H01L 29/66795 | |
| 2018/0123086 A1* | 5/2018 | Oh | H01L 27/3262 | |
| 2018/0182821 A1* | 6/2018 | Yun | H01L 27/3276 | |
| 2018/0226459 A1* | 8/2018 | Bae | H01L 27/124 | |
| 2018/0269301 A1* | 9/2018 | Cheng | H01L 29/66795 | |
| 2018/0350969 A1* | 12/2018 | Ching | H01L 29/1608 | |
| 2019/0043934 A1* | 2/2019 | Ukigaya | G09G 3/3225 | |
| 2019/0173053 A1* | 6/2019 | Choi | G06F 3/0412 | |
| 2019/0181205 A1* | 6/2019 | Kim | H01L 51/5253 | |
| 2019/0207156 A1* | 7/2019 | Gil | H01L 51/5203 | |
| 2019/0221650 A1* | 7/2019 | Zang | H01L 21/76816 | |
| 2019/0296124 A1* | 9/2019 | Hsu | H01L 29/785 | |
| 2019/0319027 A1* | 10/2019 | Chung | H01L 21/823431 | |
| 2019/0334120 A1* | 10/2019 | Seo | H01L 51/5246 | |
| 2019/0363279 A1* | 11/2019 | Yamaguchi | H01L 51/5072 | |
| 2019/0371898 A1* | 12/2019 | Huang | H01L 21/823475 | |
| 2019/0393274 A1* | 12/2019 | Park | G06F 3/0446 | |
| 2020/0006139 A1* | 1/2020 | Tseng | H01L 21/76877 | |
| 2020/0020752 A1* | 1/2020 | Shi | H01L 51/5253 | |
| 2020/0051906 A1* | 2/2020 | Liaw | H01L 23/5226 | |
| 2020/0066600 A1* | 2/2020 | Ok | H01L 21/823821 | |
| 2020/0073500 A1* | 3/2020 | Jeong | H01L 27/3244 | |
| 2020/0075692 A1* | 3/2020 | Park | H01L 27/3211 | |
| 2020/0106046 A1* | 4/2020 | Kim | H01L 27/326 | |
| 2020/0106057 A1* | 4/2020 | Yoo | H01L 27/3225 | |
| 2020/0110525 A1* | 4/2020 | Park | H01L 27/3244 | |
| 2020/0111856 A1* | 4/2020 | Lee | H01L 27/3246 | |
| 2020/0127231 A1* | 4/2020 | Yun | H01L 51/5253 | |
| 2020/0135800 A1* | 4/2020 | Seo | H01L 27/3276 | |
| 2020/0135812 A1* | 4/2020 | Ohara | G06F 3/0412 | |
| 2020/0142525 A1* | 5/2020 | Han | G06F 1/1643 | |
| 2020/0144341 A1* | 5/2020 | Choi | H01L 51/0096 | |
| 2020/0152842 A1* | 5/2020 | Park | G06F 1/1626 | |
| 2020/0159369 A1* | 5/2020 | Seo | G06F 3/041 | |
| 2020/0176531 A1* | 6/2020 | Baek | H01L 27/3223 | |
| 2020/0194510 A1* | 6/2020 | Shin | H01L 51/5209 | |
| 2020/0194532 A1* | 6/2020 | Lee | H01L 51/0096 | |
| 2020/0194714 A1* | 6/2020 | Won | H01L 27/3225 | |
| 2020/0194721 A1* | 6/2020 | Lee | H01L 51/5246 | |
| 2020/0203453 A1* | 6/2020 | Kim | H05K 1/18 | |
| 2020/0212140 A1* | 7/2020 | Huh | H01L 27/3234 | |
| 2020/0213699 A1* | 7/2020 | You | H04R 1/028 | |
| 2020/0279745 A1* | 9/2020 | Cheng | H01L 29/66568 | |
| 2020/0303245 A1* | 9/2020 | Tsai | H01L 21/7684 | |
| 2020/0303373 A1* | 9/2020 | Glass | H01L 29/205 | |

* cited by examiner

TRANSPARENT DISPLAY DEVICE

This application claims priority from and the benefit of Korean Patent Application No. 10-2018-0153734 filed on Dec. 3, 2018, which is hereby incorporated herein by reference in its entirety for all purposes as if fully set forth herein.

BACKGROUND

Technical Field

The present disclosure relates to a transparent display device, and more particularly, to a transparent display device having an emission area and a transparent area.

Discussion of the Related Art

An electroluminescent display device may be a flat panel display device. An electroluminescent display device has a wide viewing angle as compared with a liquid crystal display device because it is self-luminous, thin, light weight, and low in power consumption because a backlight unit is not necessary. In addition, an electroluminescent display device is driven by low voltages of direct current (DC) and has a fast response time. An electroluminescent display device is also resistant to external impacts and may be used in a wide range of temperatures because its components are solids. An electroluminescent display device may also be manufactured at low cost.

Recently, a transparent display device using an electroluminescent display device has been widely developed. The transparent display device is a display device in which backgrounds behind a screen are visible. Therefore, image information and the surrounding environment may be displayed together. For displaying various color images, the transparent display device using an electroluminescent display device includes a plurality of pixels, each of which has red, green and blue sub-pixels, and red, green and blue light-emitting diodes are formed in the red, green and blue sub-pixels, respectively. The red, green and blue sub-pixels have red, green and blue light-emitting layers, respectively, and the red, green and blue light-emitting layers have different properties. Accordingly, the red, green and blue light-emitting diodes have different lifetimes and efficiencies. This decreases the life of the transparent display device using an electroluminescent display device.

SUMMARY

Accordingly, the present disclosure is directed to a transparent display device that substantially obviates one or more of the problems due to limitations and disadvantages of the related art.

An object of the present disclosure is to provide a transparent display device that solves the problem of a decreased lifetime by optimizing lifetimes of light-emitting diodes.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a transparent display device, comprising: a substrate including an emission area and a first transparent area; first, second, and third pixel regions on the substrate and including the emission area and the first transparent area; a first bank on the substrate; a first opening surrounded by the first bank and corresponding to the first pixel region; a second opening surrounded by the first bank and corresponding to the second pixel region; a third opening surrounded by the first bank and corresponding to the third pixel region; a plurality of second banks overlapping at least one of the first, second, and third openings, and overlapping the first bank; and a light-emitting diode on the first, second, and third openings on the substrate.

It is to be understood that both the foregoing general description and the following detailed description are exemplary and explanatory, and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this application, illustrate example embodiments of the present disclosure and together with the description serve to explain the principles of the present disclosure. In the drawings.

DETAILED DESCRIPTION

Reference will now be made in detail to example embodiments of the disclosure, which are illustrated in the accompanying drawings.

Figure 1:
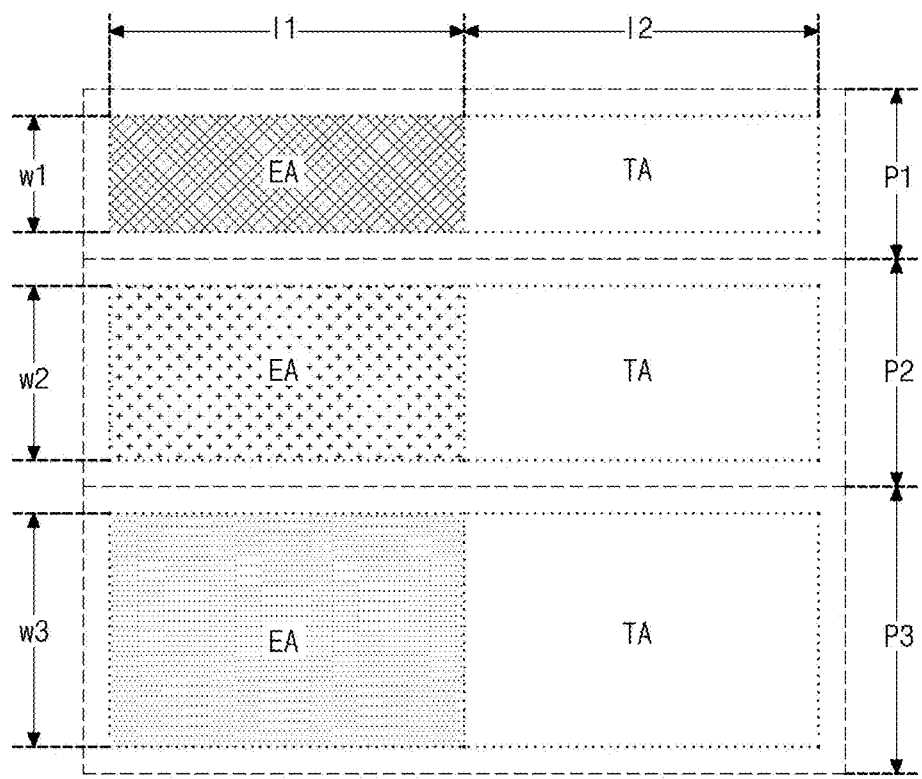
FIG. 1 illustrates one pixel of a transparent display device according to a first example embodiment of the present disclosure.

FIG. 1 illustrates one pixel of a transparent display device according to a first example embodiment of the present disclosure. In FIG. 1, a pixel of the transparent display device according to the first example embodiment of the present disclosure includes first, second and third sub-pixels P1, P2 and P3, and the first, second and third sub-pixels P1, P2 and P3 are sequentially arranged in a first direction. However, an arrangement order of the first, second and third sub-pixels P1, P2 and P3 is not limited thereto. Each of the first, second and third sub-pixels P1, P2 and P3 may include an emission area EA and a transparent area TA that may be arranged in a second direction.

A light-emitting diode (not shown) may be disposed in each of the emission areas EA of the first, second and third sub-pixels P1, P2 and P3. The emission areas EA of the first, second and third sub-pixels P1, P2 and P3 may emit light of different colors. For example, the emission areas EA of the first, second and third sub-pixels P1, P2 and P3 may emit light of red, green and blue, respectively. In addition, at least one transparent layer (not shown) transmitting light may be disposed in each of the transparent areas TA of the first, second and third sub-pixels P1, P2 and P3. Alternatively, no layer may be formed in each of the transparent areas TA of the first, second and third sub-pixels P1, P2 and P3.

The emission areas EA of the first, second and third sub-pixels P1, P2 and P3 may have different areas. For example, the area of the emission area EA of the second sub-pixel P2 may be larger than the area of the emission area EA of the first sub-pixel P1 and smaller than the area of the emission area EA of the third sub-pixel P3. For example, the area ratio of the emission areas EA of the first, second and third sub-pixels P1, P2 and P3 may be 1:1.5:2. The area ratio of the emission areas EA of the first, second and third sub-pixels P1, P2 and P3 may be determined based on the lifetimes of the light-emitting diodes provided in the respective emission areas EA, and may be varied.

The emission areas EA of the first, second and third sub-pixels P1, P2 and P3 may have different widths w1, w2 and w3 along the first direction and the same length $l_1$ along the second direction. For example, the width w2 of the emission area EA of the second sub-pixel P2 may be larger than the width w1 of the emission area EA of the first sub-pixel P1 and smaller than the width w3 of the emission area EA of the third sub-pixel P3. The widths w1, w2 and w3 of the emission areas EA of the first, second and third sub-pixels P1, P2 and P3 may have the ratio of 1:1.5:2.

The transparent areas TA of the first, second and third sub-pixels P1, P2 and P3 may also have different areas. The transparent areas TA of the first, second and third sub-pixels P1, P2 and P3 may have different widths w1, w2 and w3 along the first direction and the same length $l_2$ along the second direction. The length $l_2$ of the transparent areas TA of the first, second and third sub-pixels P1, P2 and P3 may be the same as the length $l_1$ of the emission areas EA of the first, second and third sub-pixels P1, P2 and P3, so that the area of the transparent area TA may be the same as the area of the emission area EA in each of the first, second and third sub-pixels P1, P2 and P3. Accordingly, the area of the transparent area TA of the second sub-pixel P2 may be larger than the area of the transparent area TA of the first sub-pixel P1, and smaller than the area of the transparent area TA of the third sub-pixel P3. Alternatively, the area of the transparent area TA may be different from the area of the emission area EA in each of the first, second and third sub-pixels P1, P2 and P3.

In the transparent display device according to the first example embodiment of the present disclosure, the areas of the first, second and third sub-pixels P1, P2 and P3 may be different from each other. The area of the second sub-pixel P2 may be larger than the area of the first sub-pixel P1, and smaller than the area of the third sub-pixel P3. As described above, in the transparent display device according to the first example embodiment of the present disclosure, each of the first, second and third sub-pixels P1, P2 and P3 includes the emission area EA and the transparent area TA. In this way, that the surrounding environment information such as backgrounds may be shown together through the transparent area TA while displaying the image information through the emission area EA.

In the transparent display device according to the first example embodiment of the present disclosure, the areas of the emission areas EA of the first, second and third sub-pixels P1, P2 and P3 may be different from each other. In this way, it is possible to optimize the lifetimes of the light-emitting diodes of the first, second and third sub-pixels P1, P2 and P3 according to the properties of respective luminescent materials. Therefore, the problem of the transparent display device having a decreased lifetime due to the difference in the lifetimes of light-emitting diodes may be solved.

In the transparent display device according to the first example embodiment of the present disclosure, the light-emitting diode of the emission area EA may include a light-emitting layer. As the size and resolution of the display device increase, a solution process advantageous for a display device with a large size and high definition may be used. Apparatuses used in the solution process have different implementable resolutions, and the resolution of the apparatus is determined according to the width w1 of the emission area EA in the first sub-pixel P1, which has the smallest value. However, the width w1 of the emission area EA in the first sub-pixel P1 of the transparent display device according to the first example embodiment of the present disclosure is much smaller than the width of the emission area in the sub-pixel of the conventional transparent display device. Therefore, an apparatus having higher resolution than the existing one is needed, which may increase the manufacturing cost.

Figure 2:
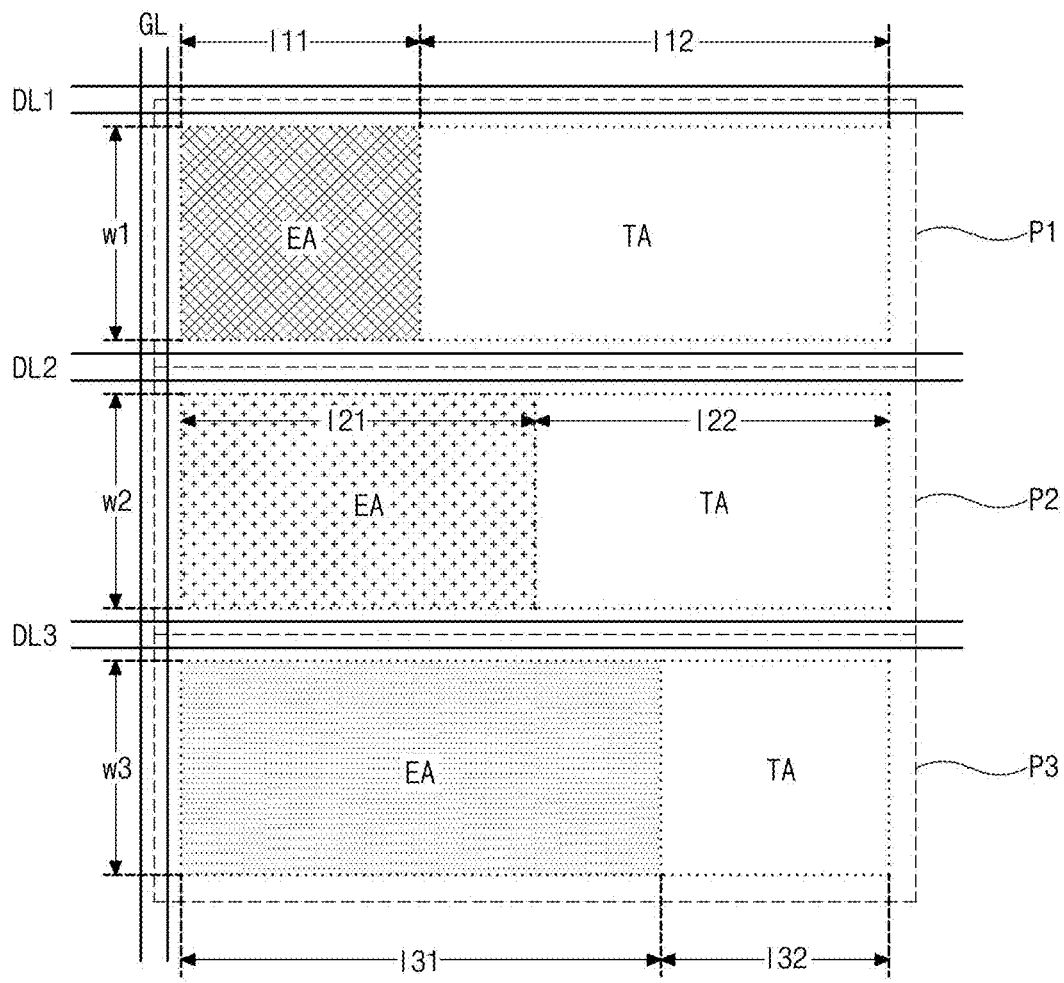
FIG. 2 illustrates a transparent display device according to a second example embodiment of the present disclosure.

FIG. 2 illustrates a transparent display device according to a second example embodiment of the present disclosure. FIG. 2 illustrates one pixel. In FIG. 2, the transparent display device according to the second example embodiment of the present disclosure includes a gate line GL extending in a first direction and first, second and third data lines DL1, DL2 and DL3 extending in a second direction on a substrate (the substrate is not shown). The gate line GL and the first, second and third data lines DL1, DL2 and DL3 cross each other to thereby define first, second and third pixel regions P1, P2 and P3. The first, second and third pixel regions P1, P2 and P3 are sequentially arranged in the first direction.

The first, second and third pixel regions P1, P2 and P3 correspond to first, second and third sub-pixels, respectively, and the first, second and third sub-pixels constitute one pixel. However, the pixel may further include one or more sub-pixels. At least one insulating layer is disposed between the gate line GL and the first, second and third data lines DL1, DL2 and DL3. Each of the first, second and third pixel regions P1, P2 and P3 includes an emission area EA and a transparent area TA arranged in the second direction.

A light-emitting diode (not shown) may be disposed in each of the emission areas EA of the first, second and third pixel regions P1, P2 and P3. In addition, at least one thin film transistor and at least one capacitor may be disposed in each of the emission areas EA of the first, second and third pixel regions P1, P2 and P3. The emission areas EA of the first, second and third pixel regions P1, P2 and P3 may emit light of different colors. For example, the emission areas EA of the first, second and third pixel regions P1, P2 and P3 may emit light of red, green and blue, respectively. In addition, at least one transparent layer (not shown) transmitting light may be disposed in each of the transparent areas TA of the first, second and third pixel regions P1, P2 and P3. Alternatively, no layer may be formed in each of the transparent areas TA of the first, second and third pixel regions P1, P2 and P3.

The emission areas EA of the first, second and third pixel regions P1, P2 and P3 may have different areas. For example, the area of the emission area EA of the second pixel region P2 may be larger than the area of the emission area EA of the first pixel region P1, and smaller than the area of the emission area EA of the third pixel region P3. For example, the area ratio of the emission areas EA of the first, second and third pixel regions P1, P2 and P3 may be 1:1.5:2. The area ratio of the emission areas EA of the first, second and third pixel regions P1, P2 and P3 may be determined based on the lifetimes of the light-emitting diodes provided in the respective emission areas EA, and may be varied.

The emission areas EA of the first, second and third pixel regions P1, P2 and P3 may have the same width along the first direction, that is, w1=w2=w3, and different lengths $l_{11}$, $l_{21}$ and $l_{31}$ along the second direction. For example, the length $l_{21}$ of the emission area EA of the second pixel region P2 may be larger than the length $l_{11}$ of the emission area EA of the first pixel region P1, and smaller than the length $l_{31}$ of the emission area EA of the third pixel region P3. The lengths $l_{11}$, $l_{21}$ and $l_{31}$ of the emission areas EA of the first, second and third pixel regions P1, P2 and P3 may have the ratio of 1:1.5:2. The length $l_{11}$ of the emission area EA of the first pixel region P1 may be equal to or larger than the width w1 of the emission area EA of the first pixel region P1.

The transparent areas TA of the first, second and third pixel regions P1, P2 and P3 may also have different areas. The transparent areas TA of the first, second and third pixel regions P1, P2 and P3 may have the same width along the first direction, that is, w1=w2=w3. The widths w1, w2 and w3 of the transparent areas TA of the first, second and third pixel regions P1, P2 and P3 may be the same as the widths w1, w2 and w3 of the emission areas EA of the first, second and third pixel regions P1, P2 and P3.

The transparent areas TA of the first, second and third pixel regions P1, P2 and P3 may have different lengths 112, 122 and 132 along the second direction. The length $l_{22}$ of the transparent area TA of the second pixel region P2 may be smaller than the length $l_{12}$ of the transparent area TA of the first pixel region P1, and larger than the length $l_{32}$ of the transparent area TA of the third pixel region P3. For example, the lengths 112, 122 and 132 of the transparent areas TA of the first, second and third pixel regions P1, P2 and P3 may have the ratio of 2:1.5:1. The length $l_2$ of the transparent areas TA of the first, second and third sub-pixels P1, P2 and P3 may be the same as the length $l_1$ of the emission areas EA of the first, second and third sub-pixels P1, P2 and P3. As such, the area of the transparent area TA may be the same as the area of the emission area EA in each of the first, second and third sub-pixels P1, P2 and P3. Accordingly, the area of the transparent area TA of the second pixel region P2 may be smaller than the area of the transparent area TA of the first pixel region P1, and larger than the area of the transparent area TA of the third pixel region P3.

The length $l_{22}$ of the transparent area TA of the second pixel region P2 may be the same as the length $l_{21}$ of the emission area EA of the second pixel region P2, the length $l_{12}$ of the transparent area TA of the first pixel region P1 may be larger than the length $l_{11}$ of the emission area EA of the first pixel region P1. The length $l_{32}$ of the transparent area TA of the third pixel region P3 may be smaller than the length $l_{31}$ of the emission area EA of the third pixel region P3.

In the transparent display device according to the second example embodiment of the present disclosure, the first, second and third pixel regions P1, P2 and P3 may have the same area. As described above, in the transparent display device according to the second example embodiment of the present disclosure, each of the first, second and third pixel regions P1, P2 and P3 includes the emission area EA and the transparent area TA. In this way, the surrounding environment information such as backgrounds may be shown together through the transparent area TA while displaying the image information through the emission area EA.

Additionally, in the transparent display device according to the second example embodiment of the present disclosure, the areas of the emission areas EA of the first, second and third pixel regions P1, P2 and P3 may be different from each other. In this way, it is possible to optimize the lifetimes of the light-emitting diodes of the first, second and third pixel regions P1, P2 and P3 according to the properties of respective luminescent materials. Therefore, the problem of the transparent display device having a decreased lifetime due to the difference in the lifetimes of light-emitting diodes may be solved.

Further, in the transparent display device according to the second example embodiment of the present disclosure, the widths w1, w2 and w3 of the emission areas EA of the first, second and third pixel regions P1, P2 and P3 may be the same, and the lengths $l_{11}$, $l_{21}$ and $l_{31}$ of the emission areas EA of the first, second and third pixel regions P1, P2 and P3 are equal to or larger than the widths w1, w2 and w3 of the emission areas EA. Accordingly, the light-emitting layers of the light-emitting diodes may be formed through the solution process using the features of the present disclosure, and the manufacturing cost may be decreased. The pixel configuration of the transparent display device according to the second example embodiment of the present disclosure may be implemented by a bank.

Figure 3:
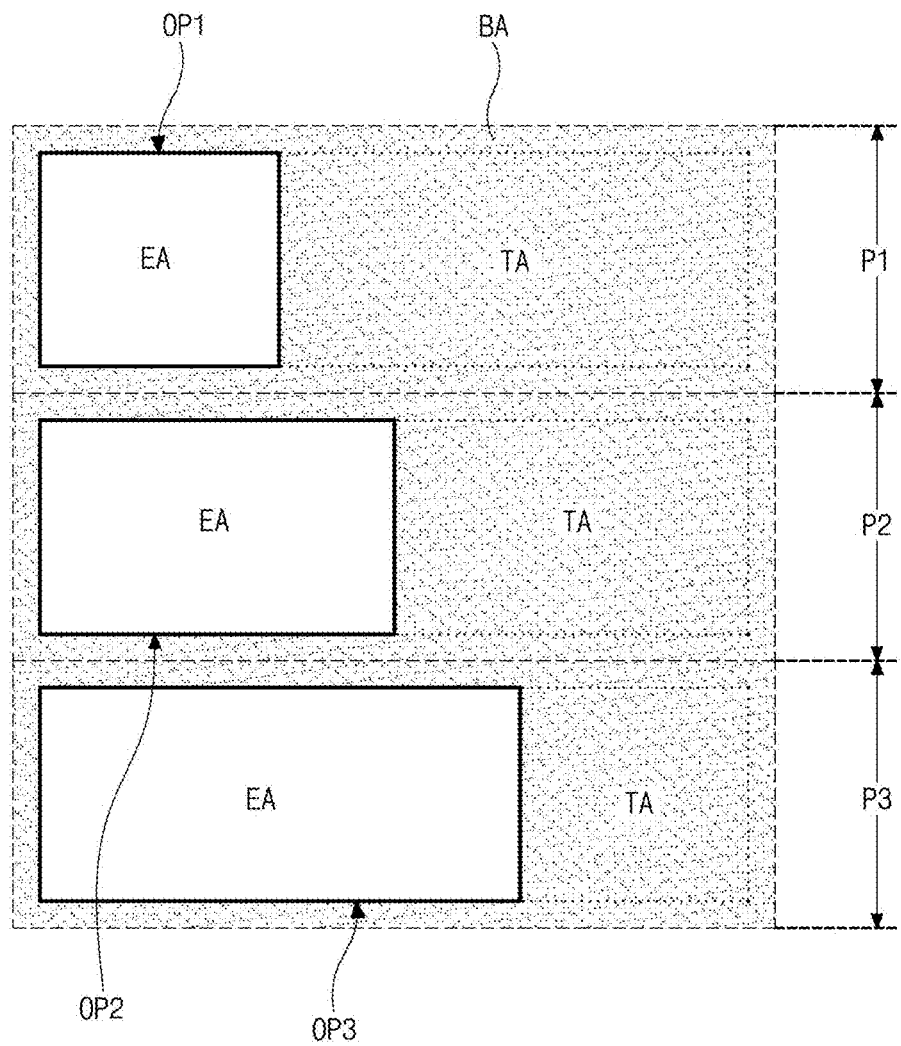
FIG. 3 illustrates a bank of a transparent display device according to the second example embodiment of the present disclosure.

FIG. 3 illustrates a bank of a transparent display device according to the second example embodiment of the present disclosure. In FIG. 3, a bank BA is formed substantially on an entire surface of a substrate (not shown). The bank BA has first, second and third openings OP1, OP2 and OP3 corresponding to emission areas EA of first, second and third pixel regions P1, P2 and P3, respectively. The second opening OP2 may be larger than the first opening OP1 and smaller than the third opening OP3. Although not shown in FIG. 3, a light-emitting diode including a first electrode, a light-emitting layer and a second electrode is provided corresponding to each of the first, second and third openings OP1, OP2 and OP3. The light-emitting diode emits light through each of the first, second and third openings OP1, OP2 and OP3.

Although the first, second and third openings OP1, OP2 and OP3 are shown as having a tetragonal shape with angled corners in FIG. 3, the shape of the first, second and third openings OP1, OP2 and OP3 is not limited thereto. Alternatively, the first, second and third openings OP1, OP2 and OP3 may have a tetragonal shape with rounded corners or may have a circular shape, an oval shape or a polygonal shape other than the tetragonal shape. The emission areas EA of the first, second and third pixel regions P1, P2 and P3 of the transparent display device according to the second example embodiment of the present disclosure have different areas, and the transparent areas TA and have substantially the same structure.

Figure 4:
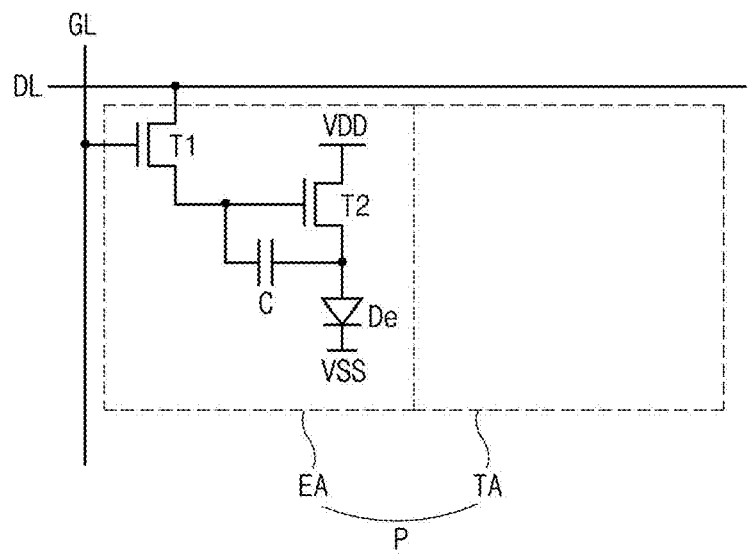
FIG. 4 is a schematic circuit diagram that illustrates one pixel region of a transparent display device according to the second example embodiment of the present disclosure.

FIG. 4 is a schematic circuit diagram that illustrates one pixel region of a transparent display device according to the second example embodiment of the present disclosure. In FIG. 4, the transparent display device according to the second example embodiment of the present disclosure includes a gate line GL and a data DL crossing each other to define a pixel region P. Each pixel region P includes an emission area EA and a transparent area TA. In addition, a switching thin film transistor T1, a driving thin film transistor T2, a storage capacitor Cst and a light-emitting diode D are formed in the emission area EA of each pixel region P.

For example, a gate electrode of the switching thin film transistor T1 is connected to the gate line GL, and a source electrode of the switching thin film transistor T1 is connected to the data line DL. A gate electrode of the driving thin film transistor T2 is connected to a drain electrode of the switching thin film transistor T1, and a source electrode of the driving thin film transistor T2 is connected to a high voltage supply VDD. An anode of the light-emitting diode De is connected to a drain electrode of the driving thin film transistor T2, and a cathode of the light-emitting diode De is connected to a low voltage supply VSS. The storage capacitor Cst is connected to the gate and drain electrodes of the driving thin film transistor T2.

In the image display operation of the transparent display device, when the switching thin film transistor T1 is turned on by a gate signal applied through the gate line GL, a data signal from the data line DL may be applied to the gate electrode of the driving thin film transistor T2 and an electrode of the storage capacitor Cst through the switching thin film transistor T1. When the driving thin film transistor T2 is turned on by the data signal, an electric current flowing through the light emitting diode De is controlled, thereby displaying an image. The light emitting diode De emits light due to the current supplied through the driving thin film transistor T2 from the high voltage supply VDD.

The amount of the current flowing through the light emitting diode De is proportional to the magnitude of the data signal, and the intensity of light emitted by the light emitting diode De is proportional to the amount of the current flowing through the light emitting diode De. Thus, the pixel regions P show different gray levels depending on the magnitude of the data signal, and as a result, the transparent display device displays an image through the emission area EA. In addition, the storage capacitor Cst maintains a charge corresponding to the data signal for a frame when the switching thin film transistor T1 is turned off. Accordingly, even if the switching thin film transistor T1 is turned off, the storage capacitor Cst allows the amount of the current flowing through the light emitting diode De to be constant and the gray level shown by the light emitting diode De to be maintained until a next frame.

One or more transistors and/or capacitors may be added in the emission area EA of the pixel region P in addition to the switching and driving thin film transistors T1 and T2 and the storage capacitor Cst. In the transparent display device including the light-emitting diode De, the data signal is applied to the gate electrode of the driving thin film transistor T2 so that the driving thin film transistor T2 maintains the turned-on state for a relatively long time in which the light-emitting diode De emits light and displays the gray scale. The driving thin film transistor T2 may deteriorate due to the application of the data signal for a long time. Accordingly, the mobility and/or threshold voltage Vth of the driving thin film transistor T2 may be changed, and the emission area EA of the pixel region P may display a different gray scale with respect to the same data signal. This may cause uneven luminance and lower image quality. To compensate for the change in the mobility and/or threshold voltage of the driving thin film transistor T2, at least one sensing thin film transistor and/or capacitor for sensing a voltage change may be further added in the emission area EA of the pixel region P. The sensing thin film transistor and/or capacitor may be connected to a reference line for applying a reference voltage and outputting a sensing voltage.

Figure 5:
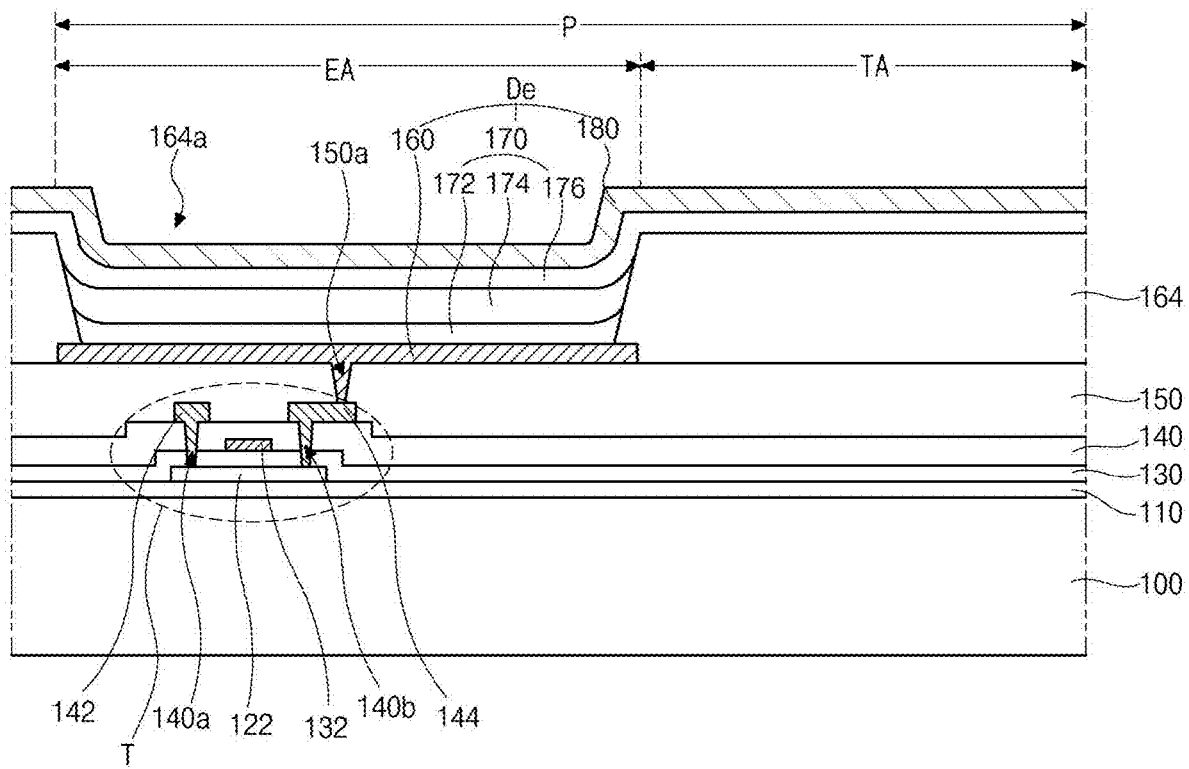
FIG. 5 is a cross-sectional view that illustrates a transparent display device according to the second example embodiment of the present disclosure.

FIG. 5 is a cross-sectional view that illustrates a transparent display device according to the second example embodiment of the present disclosure and shows one pixel region. In FIG. 5, a pixel region P including an emission area EA and a transparent area TA is defined on a substrate 100. The substrate 100 may be a glass substrate or a plastic substrate. For example, polyimide may be used as the plastic substrate. A buffer layer 110 is formed on the substrate 100. The buffer layer 110 is disposed substantially on an entire surface of the substrate 100. The buffer layer 110 may be formed of an inorganic material, such as silicon oxide ($SiO_2$) or silicon nitride (SiNx), and may be a single layer or multiple layers.

A patterned semiconductor layer 122 is formed in the emission area EA on the buffer layer 110. The semiconductor layer 122 may be formed of an oxide semiconductor layer, and a light-shielding pattern (not shown) may be further formed under the semiconductor layer 122. The light-shielding pattern may block light incident on the semiconductor layer 122 and may prevent the semiconductor layer 122 from being degraded by light. Alternatively, the semiconductor layer 122 may be formed of polycrystalline silicon, and both ends of the semiconductor layer 122 may be doped with impurities.

A gate insulating layer 130 of an insulating material is formed on the semiconductor layer 122 substantially over the entire surface of the substrate 100. The gate insulating layer 130 may be formed of an inorganic insulating material such as silicon oxide ($SiO_2$) or silicon nitride (SiNx). When the semiconductor layer 122 is made of an oxide semiconductor material, the gate insulating layer 130 may be formed of silicon oxide ($SiO_2$). Alternatively, when the semiconductor layer 122 is made of polycrystalline silicon, the gate insulating layer 130 may be formed of silicon oxide ($SiO_2$) or silicon nitride (SiNx). A gate electrode 132 of a conductive material such as metal is formed on the gate insulating layer 130 corresponding to the center of the semiconductor layer 122. In addition, a gate line (not shown) and a first capacitor electrode (not shown) may be formed on the gate insulating layer 130. The gate line extends in a first direction. The first capacitor electrode is disposed in the emission area EA and connected to the gate electrode 132.

In the second example embodiment of the present disclosure, the gate insulating layer 130 is formed over the entire surface of the substrate 100. However, the gate insulating layer 130 may be patterned to have the same shape as the gate electrode 132. An interlayer insulating layer 140 made of an insulating material is formed on the gate electrode 132 substantially over the entire surface of the substrate 100. The interlayer insulating layer 140 may be formed of an inorganic insulating material such as silicon oxide ($SiO_2$) or silicon nitride (SiNx). Alternatively, the interlayer insulating layer 140 may be formed of an organic insulating material such as photo acryl or benzocyclobutene.

The interlayer insulating layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the interlayer insulating layer 140.

Source and drain electrodes 142 and 144 of a conductive material such as metal are formed on the interlayer insulating layer 140. In addition, a data line (not shown), a power supply line (not shown) and a second capacitor electrode (not shown) may be further formed on the interlayer insulating layer 140. The source and drain electrodes 142 and 144 are spaced apart from each other with the gate electrode 132 positioned therebetween and are in contact with both ends of the semiconductor layer 122 through the first and second contact holes 140a and 140b, respectively. Although not shown in the figure, the data line extends in a second direction and crosses the gate line to thereby define the pixel region P. The power supply line for supplying a high voltage is spaced apart from the data line. The second capacitor electrode is disposed in the emission area EA and is connected to the drain electrode 144. The second capacitor electrode overlaps the first capacitor electrode to thereby constitute a storage capacitor with the interlayer insulating layer 140 therebetween as a dielectric.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122. Alternatively, the thin film transistor may have an inverted staggered structure in which the gate electrode and the source and drain electrodes are located at different sides with respect to the semiconductor layer. That is, the gate electrode may be disposed under the semiconductor layer, and the source and drain electrodes may be disposed over the semiconductor layer. The semiconductor layer may be formed of oxide semiconductor or amorphous silicon.

The thin film transistor T corresponds to a driving thin film transistor, and a switching thin film transistor (not shown) having the same structure as the driving thin film transistor T may be further formed on the substrate 100 corresponding to the emission area EA of the pixel region P. The gate electrode 132 of the driving thin film transistor T may be connected to a drain electrode (not shown) of the switching thin film transistor, and the source electrode 142 of the driving thin film transistor T is connected to the power supply line. In addition, a gate electrode (not shown) and a source electrode (not shown) of the switching thin film transistor may be connected to the gate line and the data line, respectively. A sensing thin film transistor having the same structure of the driving thin film transistor T may be further formed on the substrate 100 corresponding to the emission area EA of the pixel region P.

A passivation layer 150 of an insulating material is formed on the source and drain electrodes 142 and 144 substantially over the entire surface of the substrate 100. The passivation layer 150 may be formed of an inorganic insulating material such as silicon oxide ($SiO_2$) or silicon nitride (SiNx), or an organic insulating material such as photo acryl or benzocyclobutene. The passivation layer 150 may have a flat top surface. The passivation layer 150 has a drain contact hole 150a exposing the drain electrode 144. The drain contact hole 150a may be spaced apart from the second contact hole 140b. Alternatively, the drain contact hole 150a may be disposed right over the second contact hole 140b. When the passivation layer 150 is formed of an organic insulating material, an insulating layer of an inorganic insulating material may be further formed under the passivation layer 150.

A first electrode 160 is formed on the passivation layer 150 and formed of a conductive material having a relatively high work function. The first electrode 160 is disposed in the emission area EA of the pixel region P and is in contact with the drain electrode 144 through the drain contact hole 150a. The first electrode 160 is not formed in the transparent area TA. For example, the first electrode 160 may be formed of a transparent conductive material such as indium tin oxide (ITO) or indium zinc oxide (IZO).

The transparent display device according to the second example embodiment of the present disclosure is a top emission type in which light of a light-emitting diode De provided in the emission area EA is output toward a direction opposite the substrate 100. Accordingly, the first electrode 160 may further include a reflective electrode or a reflective layer formed of a metal material having a relatively high reflectance below the transparent conductive material. For example, the reflective electrode or reflective layer may be formed of an aluminum-palladium-copper (APC) alloy or silver (Ag). The first electrode 160 may have a triple-layer structure of ITO/APC/ITO or ITO/Ag/ITO.

A bank 164 of an insulating material is formed on the first electrode 160. The bank 164 may be formed of an organic insulating material having a hydrophobic property. The bank 164 has an opening 164a exposing the first electrode 160 corresponding to the emission area EA and covers edges of the first electrode 160. The bank 164 is illustrated in FIG. 5 as having a single-layered structure. For example, a first bank having a hydrophilic property may be further formed between the first electrode 160 and a second bank having a hydrophobic property, and the first bank may have a wider width than the second bank. The first bank may cover the edges of the first electrode 160, and the second bank cannot overlap the first electrode 160.

A light-emitting layer 170 is formed on the first electrode 160 exposed through the opening 164a of the bank 164. The light-emitting layer 170 may include a first charge auxiliary layer 172, a light-emitting material layer 174, and a second charge auxiliary layer 176, that are sequentially positioned over the first electrode 160. The light-emitting material layer 174 may be formed of any one of red, green and blue luminescent materials. The luminescent material may be an organic luminescent material such as a phosphorescent compound or a fluorescent compound or may be an inorganic luminescent material such as a quantum dot.

The first charge auxiliary layer 172 may be a hole auxiliary layer, and the hole auxiliary layer 172 may include at least one of a hole injecting layer (HIL) and a hole transporting layer (HTL). In addition, the second charge auxiliary layer 176 may be an electron auxiliary layer, and the electron auxiliary layer 176 may include at least one of an electron injecting layer (EIL) and an electron transporting layer (ETL). Alternatively, the first charge auxiliary layer 172 may be an electron auxiliary layer, and the second charge auxiliary layer 176 may be a hole auxiliary layer.

The hole auxiliary layer 172 and the light-emitting material layer 174 may be formed through a solution process. Thus, the process may be simplified and a display device with a large size and high resolution may be provided. A spin coating method, an ink jet printing method, or a screen printing method may be used as the solution process, but the present disclosure is not limited thereto. When the solution is dried, a drying speed of a solvent in a region adjacent to the bank 162 is different from that in other regions. Therefore, heights of the hole auxiliary layer 172 and the light-emitting material layer 174 in the region adjacent to the bank 162 may rise as it gets closer to the bank 162. The hole auxiliary layer 172 and the light-emitting material layer 174 are disposed in the emission area EA of the pixel region P and are not disposed in the transparent area TA.

Alternatively, the electron auxiliary layer 176 may be formed through a vacuum evaporation process. The electron auxiliary layer 176 may be formed substantially over the entire surface of the substrate 100 and may be disposed both in the emission area EA and the transparent area TA of the pixel region P. In other example embodiments, the electron auxiliary layer 176 may be removed in the transparent area TA. Alternatively, the electron auxiliary layer 176 may be formed through a solution process, and the electron auxiliary layer 176 may be disposed in the emission area EA and not disposed in the transparent area TA of the pixel region P.

A second electrode 180 of a conductive material having a relatively low work function is formed on the light-emitting layer 170 substantially over the entire surface of the substrate 100. The second electrode 180 may be formed of aluminum (Al), magnesium (Mg), silver (Ag), or an alloy thereof. The second electrode 180 has a relatively thin thickness such that light from the light-emitting layer 170 may be transmitted therethrough. Alternatively, the second electrode 180 may be formed of a transparent conductive material such as indium-gallium-oxide (IGO).

The first electrode 160, the light-emitting layer 170 and the second electrode 180 constitute a light-emitting diode De. The first electrode 160 may serve as an anode, and the second electrode 180 may serve as a cathode. As described above, the transparent display device according to the second example embodiment of the present disclosure may be a top emission type in which light from the light-emitting layer 170 of the light-emitting diode De is output toward a direction opposite the substrate 100, that is, output to the outside through the second electrode 180. The top emission type display device may have a wider emission area than a bottom emission type display device of the same size, to improve luminance and reduce power consumption.

The light-emitting diode De of each pixel region P may have an element thickness for a micro-cavity effect corresponding to a wavelength of the emitted light, thereby increasing the light efficiency. A protective layer and/or an encapsulating layer (not shown) may be formed on the second electrode 180 substantially over the entire surface of the substrate 100 to block moisture or oxygen introduced from the outside, thereby protecting the light-emitting diode De. In the transparent display device according to the second example embodiment of the present disclosure, the pixel region P includes the emission area EA and the transparent area TA, so that the surrounding environment information such as backgrounds may be shown together through the transparent area TA while displaying the image information through the emission area EA.

Figure 6:
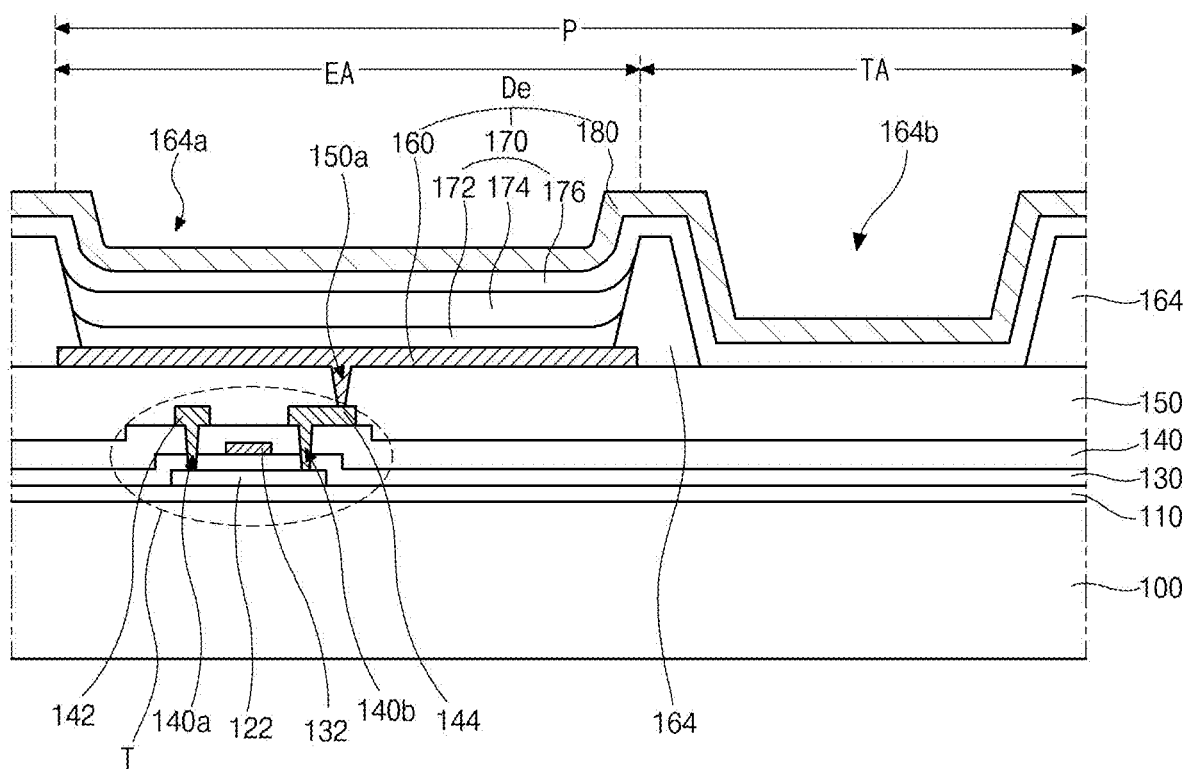
FIG. 6 is a cross-sectional view that illustrates a transparent display device of another example according to the second example embodiment of the present disclosure.

FIG. 6 is a cross-sectional view of a transparent display device of another example according to the second example embodiment of the present disclosure. The transparent display device of FIG. 6 has the same structure as the transparent display device of FIG. 5 except for a bank structure. The same parts will be designated by the same references, and descriptions of the same parts will be omitted.

As shown in FIG. 6, in another example according to the second example embodiment of the present disclosure, the bank 164 is removed in a region corresponding to the transparent area TA to thereby have a transmissive hole 164b. Accordingly, a top surface of the passivation layer 150 corresponding to the transparent area TA may be exposed through the transmissive hole 164b, and the electron auxiliary layer 176 may be in contact with the exposed top surface of the passivation layer 150. In another example according to the second example embodiment of the present disclosure, because the bank 164 is not disposed in the transparent area TA, transmittance of the transparent display device may be increased as compared with the example embodiment illustrated in FIG. 5.

In the transparent display device according to the second example embodiment of the present disclosure, a solution process apparatus such as an inkjet apparatus scans back and forth along the first direction, thereby forming the light-emitting layer. The length $l_{11}$ of the emission area EA of the first pixel region P1 in the transparent display device of FIG. 2 is smaller than the length $l_1$ of the emission area EA of the first pixel region P1 in the transparent display device according to the first example embodiment of FIG. 1. As a result, the number of nozzles corresponding to the length $l_{11}$ of the emission area EA of the first pixel region P1 of FIG. 2 decreases compared to the number of nozzles in the first example embodiment. Therefore, the process time required for scanning may increase.

Figure 7:
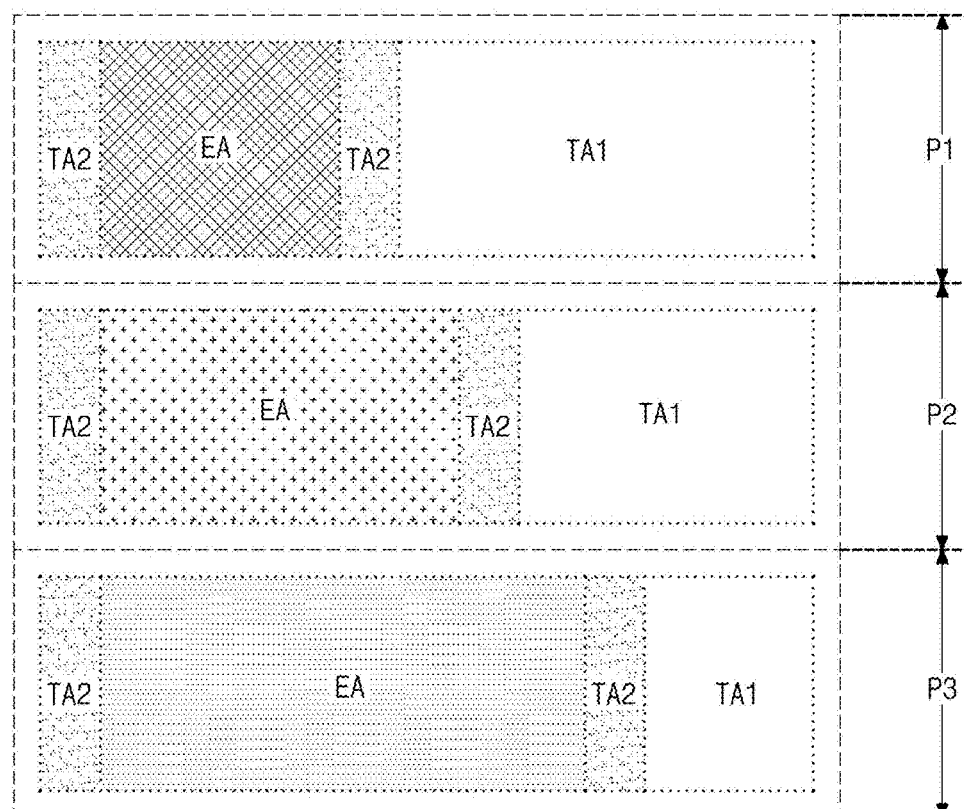
FIG. 7 illustrates a transparent display device according to a third example embodiment of the present disclosure.

FIG. 7 illustrates a transparent display device according to a third example embodiment of the present disclosure. FIG. 7 illustrates one pixel. In FIG. 7, the transparent display device according to the third example embodiment of the present disclosure may include a gate line (not shown) extending in a first direction and data lines (not shown) extending in a second direction. The gate line and the data lines cross each other to thereby define first, second and third pixel regions P1, P2 and P3. The gate line and the data lines may be configured to be substantially the same as those in the second example embodiment illustrated in FIG. 2.

The first, second and third pixel regions P1, P2 and P3 may be sequentially arranged in the first direction. The first, second and third pixel regions P1, P2 and P3 correspond to first, second and third sub-pixels, respectively, and the first, second and third sub-pixels constitute one pixel. However, the pixel may further include one or more sub-pixels. Each of the first, second and third pixel regions P1, P2 and P3 includes an emission area EA and a transparent area TA1 and TA2 arranged in the second direction. The transparent area TA1 and TA2 includes a first transparent area TA1 and a second transparent area TA2. The first and second transparent areas TA1 and TA2 have different transmittances. The second transparent area TA2 is divided into a first portion and a second portion. The first portion of the second transparent area TA2 may be disposed between the emission area EA and the first transparent area TA1. The emission area EA may be disposed between the first portion and the second portion of the second transparent area TA2. The transmittance of the second transparent area TA2 may be higher than the transmittance of the first transparent area TA1. Alternatively, the transmittance of the first transparent area TA1 may be higher than the transmittance of the second transparent area TA2.

A light-emitting diode (not shown) is disposed in each of the emission areas EA of the first, second and third pixel regions P1, P2 and P3. At least one thin film transistor and at least one capacitor are disposed in each of the emission areas EA of the first, second and third pixel regions P1, P2 and P3. The emission areas EA of the first, second and third pixel regions P1, P2 and P3 may emit light of different colors. For example, the emission areas EA of the first, second and third pixel regions P1, P2 and P3 may emit light of red, green and blue, respectively.

In addition, at least one transparent layer (not shown) transmitting light may be disposed in each of the first and second transparent areas TA1 and TA2 of the first, second and third pixel regions P1, P2 and P3. A type and/or number of layers disposed in the first and second transparent areas TA1 and TA2, respectively, may be different. The emission areas EA of the first, second and third pixel regions P1, P2 and P3 may have different areas. For example, the area of the emission area EA of the second pixel region P2 may be larger than the area of the emission area EA of the first pixel region P1, and smaller than the area of the emission area EA of the third pixel region P3. For example, the area ratio of the emission areas EA of the first, second and third pixel regions P1, P2 and P3 may be 1:1.5:2. The area ratio of the emission areas EA of the first, second and third pixel regions P1, P2 and P3 may be determined based on the lifetimes of the light-emitting diodes provided in the respective emission areas EA and may be varied.

The emission areas EA of the first, second and third pixel regions P1, P2 and P3 may have the same width along the first direction and different lengths along the second direction. For example, the length of the emission area EA of the second pixel region P2 may be larger than the length of the emission area EA of the first pixel region P1 and smaller than the length of the emission area EA of the third pixel region P3. The lengths of the emission areas EA of the first, second and third pixel regions P1, P2 and P3 may have the ratio of 1:1.5:2. The length of the emission area EA of the first pixel region P1 may be equal to or larger than the width of the emission area EA of the first pixel region P1.

In addition, the first transparent areas TA1 of the first, second and third pixel regions P1, P2 and P3 may also have different areas. The first transparent areas TA1 of the first, second and third pixel regions P1, P2 and P3 may have the same width along the first direction and different lengths along the second direction. The length of the first transparent area TA1 of the second pixel region P2 may be smaller than the length of the first transparent area TA1 of the first pixel region P1, and larger than the length of the first transparent area TA1 of the third pixel region P3.

The second transparent areas TA2 of the first, second and third pixel regions P1, P2 and P3 may have the same area. The first portion and the second portion of the second transparent area TA2 in each of the first, second and third pixel regions P1, P2 and P3 may have the same area or different areas. In each pixel region, the total area of the second transparent area TA2 may be ½ to 1 times the area of the emission area EA of the first pixel region P1. Accordingly, the first, second and third pixel regions P1, P2 and P3 may have different total areas of the first and second transparent areas TA1 and TA2. The total area of the first and second transparent areas TA1 and TA2 in the second pixel region P2 may be smaller than the total area of the first and second transparent areas TA1 and TA2 in the first pixel region P1, and larger than the total area of the first and second transparent areas TA1 and TA2 in the third pixel region P3. For example, the total areas of the first and second transparent areas TA1 and TA2 of the first, second and third pixel regions P1, P2 and P3 may have the ratio of 2:1.5:1.

The total area of the first and second transparent areas TA1 and TA2 may be equal to the area of the emission area EA in the second pixel region P2. The total area of the first and second transparent areas TA1 and TA2 may be larger than the area of the emission area EA in the first pixel region P1. The total area of the first and second transparent areas TA1 and TA2 may be smaller than the area of the emission area EA in the third pixel region P3.

In the transparent display device according to the third example embodiment of the present disclosure, the first, second and third pixel regions P1, P2 and P3 may have the same area. As described above, in the transparent display device according to the third example embodiment of the present disclosure, each of the first, second and third pixel regions P1, P2 and P3 includes the emission area EA and the first and second transparent areas TA1 and TA2. In this way, the surrounding environment information such as backgrounds may be shown together through the first and second transparent areas TA1 and TA2 while displaying the image information through the emission area EA.

In the transparent display device according to the third example embodiment of the present disclosure, the areas of the emission areas EA of the first, second and third pixel regions P1, P2 and P3 are different from each other. In this way, it is possible to optimize the lifetimes of the light-emitting diodes of the first, second and third pixel regions P1, P2 and P3 according to the properties of respective luminescent materials. Therefore, the problem of the transparent display device having a decreased lifetime due to the difference in the lifetimes of light-emitting diodes may be solved.

In the transparent display device according to the third example embodiment of the present disclosure, the widths of the emission areas EA of the first, second and third pixel regions P1, P2 and P3 are the same, and the lengths of the emission areas EA are equal to or larger than the widths of the emission areas EA. Accordingly, the light-emitting layers of the light-emitting diodes may be formed through the solution process using the features of the present disclosure, and the manufacturing cost may be prevented from being increased.

In the transparent display device according to the third example embodiment of the present disclosure, the light-emitting layers are formed in the second transparent areas TA2 as well as in the emission areas EA of the first, second and third pixel regions P1, P2 and P3 through the solution process. As such, the number of corresponding nozzles for forming the light-emitting layers may be increased. Therefore, the number of scanning steps may be decreased, and the processing time required for scanning may be reduced. The pixel configuration of the transparent display device according to the third example embodiment of the present disclosure may be implemented by a bank, as illustrated in the following figures.

Figure 8:
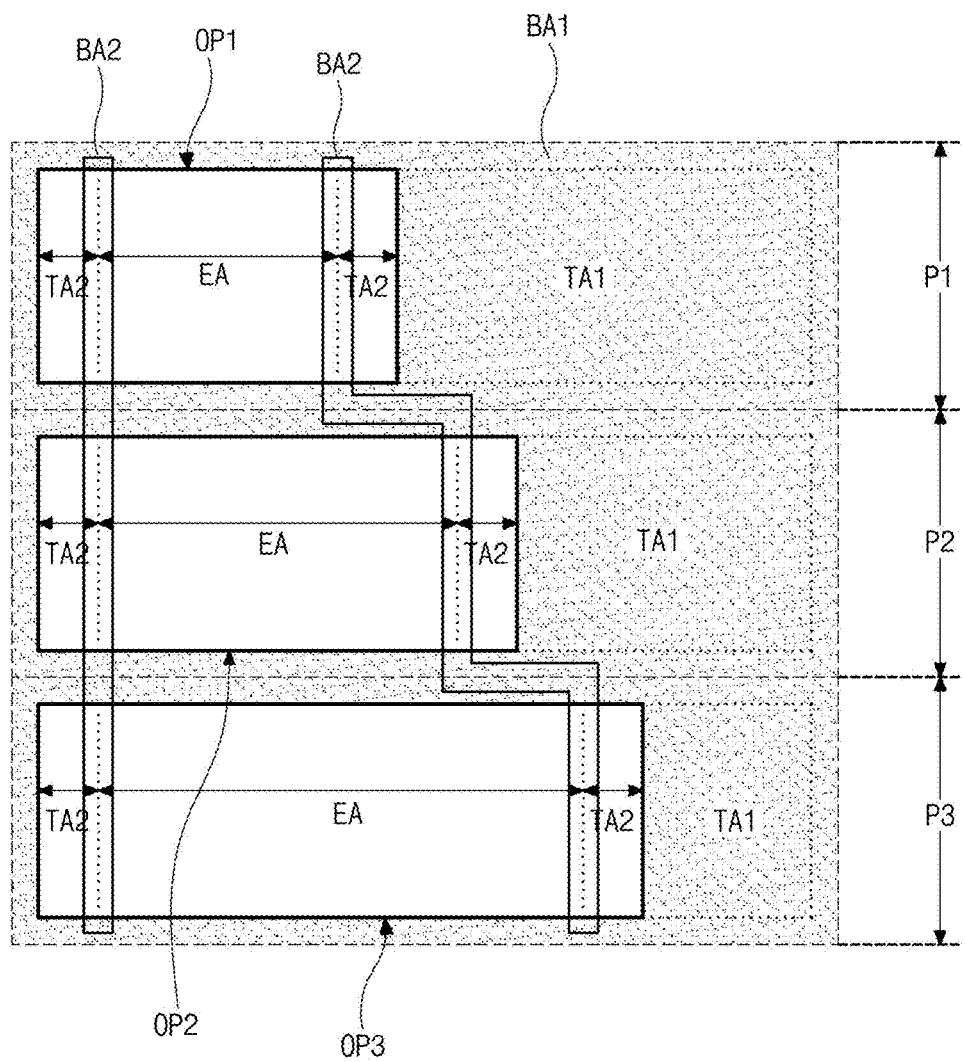
FIG. 8 illustrates a bank of a transparent display device according to the third example embodiment of the present disclosure.

FIG. 8 illustrates a bank of a transparent display device according to the third example embodiment of the present disclosure. In FIG. 8, a first bank BA1 is formed substantially on an entire surface of a substrate (not shown), and the first bank BA1 has first, second and third openings OP1, OP2 and OP3 in first, second and third pixel regions P1, P2 and P3, respectively. The first, second and third openings OP1, OP2 and OP3 each correspond to the emission area EA and the second transparent area TA2 of the respective pixel regions P1, P2 and P3. The second opening OP2 is larger than the first opening OP1 and smaller than the third opening OP3.

In addition, a second bank BA2 is formed corresponding to a border between the emission area EA and the second transparent area TA2 in each of the first, second and third pixel regions P1, P2 and P3. The second bank BA2 formed in the second pixel region P2 may be connected to the second bank BA2 formed in at least one of the first pixel region P1 and the third pixel region P3. The contact area between the second banks BA2 and the underlying layer increases, so that the risk of losing the second banks BA2 may be lowered. Alternatively, the second banks BA2 may be separated for respective pixel regions P1, P2 and P3.

In some example embodiments, the second banks BA2 may overlap at least one of the first, second and third openings OP1, OP2 and OP3, and/or may overlap the first bank BA1. The second banks BA2 may be separated from each other by a first distance in the first pixel region P1, a second distance in the second pixel region P2 and a third distance in the third pixel region P3, that are different from each other. The third distance may be greater than the second distance, and the second distance may be greater than the first distance.

In example embodiments where the second banks BA2 overlap at least one of the first, second and third openings OP1, OP2 and OP3, and/or the first bank BA1, the portions overlapping the first bank BA1 between the first and second pixel regions P1 and P2 may be separated from each other by a first distance. The portions overlapping the first bank BA1 between the second and third pixel regions P2 and P3 may be separated from each other by a second distance that is different from the first distance. The second distance may be greater than the first distance. In some embodiments, the portions of the second banks BA2 overlapping the first bank between the first, second and third pixel regions P1, P2, and P3 may have different sizes, lengths, and/or widths.

Although not shown in the figure, a light-emitting diode including a first electrode, a light-emitting layer and a second electrode is provided corresponding to each of the emission areas EA of the first, second and third pixel regions P1, P2 and P3. The light-emitting diode emits light through each of the first, second and third openings OP1, OP2 and OP3. Although the first, second and third openings OP1, OP2 and OP3 are shown as having a tetragonal shape with angled corners, the shape of the first, second and third openings OP1, OP2 and OP3 is not limited thereto. Alternatively, the first, second and third openings OP1, OP2 and OP3 may have a tetragonal shape with rounded corners or may have a circular shape, an oval shape or a polygonal shape other than the tetragonal shape.

The first, second and third pixel regions P1, P2 and P3 of the transparent display device according to the third example embodiment of the present disclosure have the difference in the areas of the emission areas EA and the first transparent areas TA1 and have substantially the same structure. The circuit configuration of the emission area EA of each pixel region P1, P2 and P3 may have the same structure as that of FIG. 4. The cross-sectional structure of each pixel region P1, P2 and P3 will be described in more detail with reference to FIG. 9.

Figure 9:
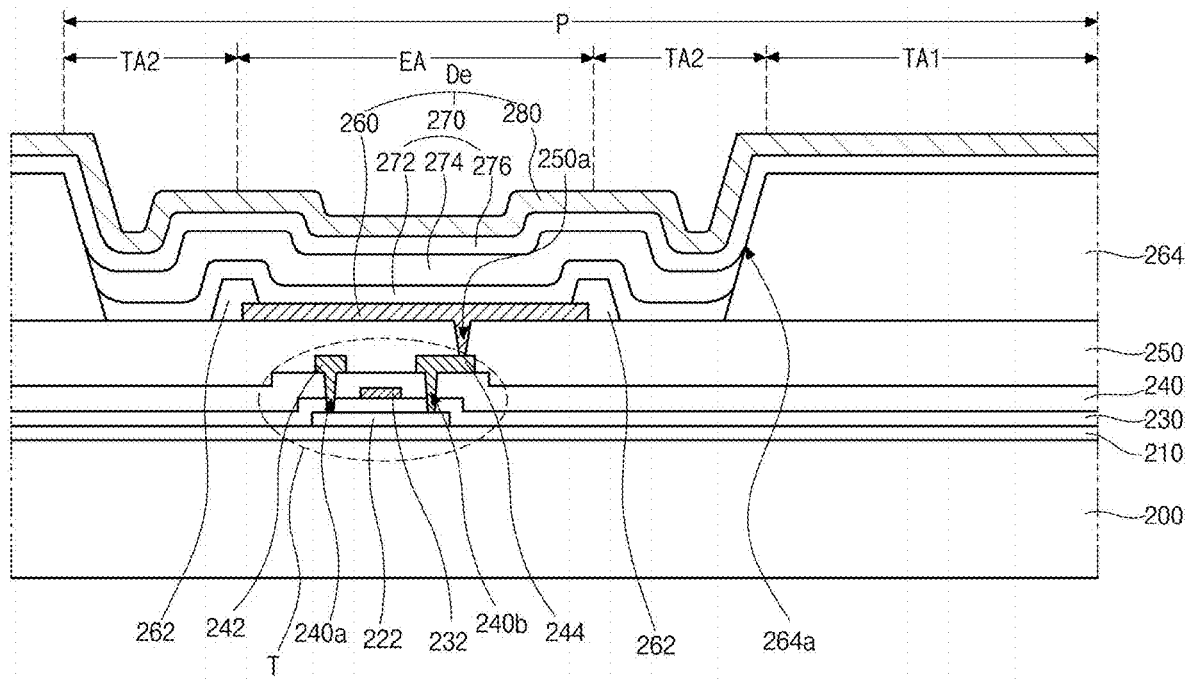
FIG. 9 is a cross-sectional view that illustrates a transparent display device according to the third example embodiment of the present disclosure.

FIG. 9 is a cross-sectional view of a transparent display device according to the third example embodiment of the present disclosure. FIG. 9 shows one pixel region. In FIG. 9, a pixel region P including an emission area EA and a transparent area TA1 and TA2 is defined on a substrate 200. The transparent area TA1 and TA2 includes a first transparent area TA1 and a second transparent area TA2, and the second transparent area TA2 includes a first portion and a second portion. The first portion of the second transparent area TA2 is disposed between the emission area EA and the first transparent area TA1, and the emission area EA is disposed between the first portion and the second portion of the second transparent area TA2.

The substrate 200 may be a glass substrate or a plastic substrate. For example, polyimide may be used as the plastic substrate. A buffer layer 210 is formed on the substrate 200. The buffer layer 210 is disposed substantially on an entire surface of the substrate 200. The buffer layer 210 may be formed of an inorganic material such as silicon oxide ($SiO_2$) or silicon nitride (SiNx) and may be a single layer or multiple layers.

A patterned semiconductor layer 222 is formed in the emission area EA on the buffer layer 210. The semiconductor layer 222 may be formed of an oxide semiconductor layer, and in this case, a light-shielding pattern (not shown) may be further formed under the semiconductor layer 222. The light-shielding pattern blocks light incident on the semiconductor layer 222 and prevents the semiconductor layer 222 from being degraded by light. Alternatively, the semiconductor layer 222 may be formed of polycrystalline silicon, and both ends of the semiconductor layer 222 may be doped with impurities.

A gate insulating layer 230 of an insulating material is formed on the semiconductor layer 222 substantially over the entire surface of the substrate 200. The gate insulating layer 230 may be formed of an inorganic insulating material such as silicon oxide ($SiO_2$) or silicon nitride (SiNx). When the semiconductor layer 222 is made of an oxide semiconductor material, the gate insulating layer 230 may be preferably formed of silicon oxide ($SiO_2$). Alternatively, when the semiconductor layer 222 is made of polycrystalline silicon, the gate insulating layer 230 may be formed of silicon oxide ($SiO_2$) or silicon nitride (SiNx).

A gate electrode 232 of a conductive material such as metal is formed on the gate insulating layer 230 corresponding to the center of the semiconductor layer 222. In addition, a gate line (not shown) and a first capacitor electrode (not shown) may be formed on the gate insulating layer 230. The gate line extends in a first direction. The first capacitor electrode is disposed in the emission area EA and connected to the gate electrode 232.

In the third example embodiment of the present disclosure, the gate insulating layer 230 is formed over the entire surface of the substrate 200. However, the gate insulating layer 230 may be patterned to have the same shape as the gate electrode 232. An interlayer insulating layer 240 made of an insulating material is formed on the gate electrode 232 substantially over the entire surface of the substrate 200. The interlayer insulating layer 240 may be formed of an inorganic insulating material such as silicon oxide ($SiO_2$) or silicon nitride (SiNx). Alternatively, the interlayer insulating layer 240 may be formed of an organic insulating material such as photo acryl or benzocyclobutene.

The interlayer insulating layer 240 has first and second contact holes 240a and 240b exposing top surfaces of both ends of the semiconductor layer 222. The first and second contact holes 240a and 240b are disposed at both sides of the gate electrode 232 and spaced apart from the gate electrode 232. The first and second contact holes 240a and 240b are also formed in the gate insulating layer 230. Alternatively, when the gate insulating layer 230 is patterned to have the same shape as the gate electrode 232, the first and second contact holes 240a and 240b are formed only in the interlayer insulating layer 240.

Source and drain electrodes 242 and 244 of a conductive material such as metal are formed on the interlayer insulating layer 240. In addition, a data line (not shown), a power supply line (not shown) and a second capacitor electrode (not shown) may be further formed on the interlayer insulating layer 240. The source and drain electrodes 242 and 244 are spaced apart from each other with the gate electrode 232 positioned therebetween and are in contact with both ends of the semiconductor layer 222 through the first and second contact holes 240a and 240b, respectively. Although not shown in the figure, the data line extends in a second direction and crosses the gate line to thereby define the pixel region P. The power supply line for supplying a high voltage is spaced apart from the data line. The second capacitor electrode is disposed in the emission area EA and is connected to the drain electrode 244. The second capacitor electrode overlaps the first capacitor electrode to thereby constitute a storage capacitor with the interlayer insulating layer 240 therebetween as a dielectric.

The semiconductor layer 222, the gate electrode 232, and the source and drain electrodes 242 and 244 form a thin film transistor T. The thin film transistor T has a coplanar structure in which the gate electrode 232 and the source and drain electrodes 242 and 244 are located at the same side with respect to the semiconductor layer 222. Alternatively, the thin film transistor may have an inverted staggered structure in which the gate electrode and the source and drain electrodes are located at different sides with respect to the semiconductor layer. That is, the gate electrode is disposed under the semiconductor layer, and the source and drain electrodes are disposed over the semiconductor layer. In this case, the semiconductor layer may be formed of oxide semiconductor or amorphous silicon.

The thin film transistor T corresponds to a driving thin film transistor. A switching thin film transistor (not shown) having the same structure as the driving thin film transistor T is further formed on the substrate 200 corresponding to the emission area EA of the pixel region P. The gate electrode 232 of the driving thin film transistor T may be connected to a drain electrode (not shown) of the switching thin film transistor, and the source electrode 242 of the driving thin film transistor T may be connected to the power supply line. A gate electrode (not shown) and a source electrode (not shown) of the switching thin film transistor may be connected to the gate line and the data line, respectively. A sensing thin film transistor having the same structure of the driving thin film transistor T may be further formed on the substrate 200 corresponding to the emission area EA of the pixel region P.

A passivation layer 250 of an insulating material is formed on the source and drain electrodes 242 and 244 substantially over the entire surface of the substrate 200. The passivation layer 250 may be formed of an inorganic insulating material such as silicon oxide ($SiO_2$) or silicon nitride (SiNx) or an organic insulating material, such as photo acryl or benzocyclobutene. The passivation layer 250 may have a flat top surface. The passivation layer 250 has a drain contact hole 250a exposing the drain electrode 244. The drain contact hole 250a may be spaced apart from the second contact hole 240b. Alternatively, the drain contact hole 250a may be disposed directly over the second contact hole 240b. When the passivation layer 250 is formed of an organic insulating material, an insulating layer of an inorganic insulating material may be further formed under the passivation layer 250.

A first electrode 260 is formed on the passivation layer 250 and formed of a conductive material having a relatively high work function. The first electrode 260 is disposed in the emission area EA of the pixel region P and is in contact with the drain electrode 244 through the drain contact hole 250a. The first electrode 260 is not formed in the first transparent area TA1 and the second transparent area TA2. For example, the first electrode 260 may be formed of a transparent conductive material, such as indium tin oxide (ITO) or indium zinc oxide (IZO).

The transparent display device according to the third example embodiment of the present disclosure is a top emission type in which light of a light-emitting diode De provided in the emission area EA is output toward a direction opposite the substrate 200. Accordingly, the first electrode 260 may further include a reflective electrode or a reflective layer formed of a metal material having a relatively high reflectance below the transparent conductive material. For example, the reflective electrode or reflective layer may be formed of an aluminum-palladium-copper (APC) alloy or silver (Ag). The first electrode 260 may have a triple-layer structure of ITO/APC/ITO or ITO/Ag/ITO.

A lower bank 262 of an insulating material is formed on the first electrode 260 and the passivation layer 250. The lower bank 262 corresponds to a border of the emission area EA and the second transparent area TA2, covers opposite edges of the first electrode 260, and exposes the first electrode 260 corresponding to the emission area EA. The lower bank 262 may be formed of a material having a hydrophilic property, for example, an inorganic insulating material, such as silicon oxide ($SiO_2$) or silicon nitride (SiNx). Alternatively, the lower bank 262 may be formed of polyimide.

In addition, an upper bank 264 of an insulating material is formed on the passivation layer 250. A thickness of the upper bank 264 is thicker than that of the lower bank 262. The upper bank 264 may be formed of an organic insulating material having a hydrophobic property. The upper bank 264 has an opening 264a exposing the first electrode 260 and the lower bank 262 corresponding to the emission area EA and the second transparent area TA2. A top surface of the passivation layer 250 corresponding to the second transparent area TA2 may be exposed through the opening 264a. The upper bank 264 may have a transmissive hole (not shown) corresponding to the first transparent area TA1. In this case, the upper surface of the passivation layer 250 corresponding to the first transparent area TA1 may be exposed through the transmissive hole.

A light-emitting layer 270 is formed on the first electrode 260, the lower bank 262 and the passivation layer 250 exposed through the opening 264a of the upper bank 264. The light-emitting layer 270 may include a first charge auxiliary layer 272, a light-emitting material layer 274, and a second charge auxiliary layer 276 sequentially positioned over the first electrode 260. The light-emitting material layer 274 may be formed of any one of red, green and blue luminescent materials. The luminescent material may be an organic luminescent material such as a phosphorescent compound or a fluorescent compound or may be an inorganic luminescent material such as a quantum dot.

The first charge auxiliary layer 272 may be a hole auxiliary layer, and the hole auxiliary layer 272 may include at least one of a hole injecting layer (HIL) and a hole transporting layer (HTL). In addition, the second charge auxiliary layer 276 may be an electron auxiliary layer, and the electron auxiliary layer 276 may include at least one of an electron injecting layer (EIL) and an electron transporting layer (ETL). Alternatively, the first charge auxiliary layer 272 may be an electron auxiliary layer, and the second charge auxiliary layer 276 may be a hole auxiliary layer.

The hole auxiliary layer 272 and the light-emitting material layer 274 may be formed through a solution process. Thus, the process may be simplified and a display device with a large size and high resolution may be provided. A spin coating method, an ink jet printing method, or a screen printing method may be used as the solution process. When the solution is dried, a drying speed of a solvent in a region adjacent to the upper bank 264 is different from that in other regions. Therefore, heights of the hole auxiliary layer 272 and the light-emitting material layer 274 in the region adjacent to the upper bank 264 may rise as it gets closer to the upper bank 264. The hole auxiliary layer 272 and the light-emitting material layer 274 are disposed in the emission area EA and the second transparent area TA2 of the pixel region P and are not disposed in the first transparent area TA1.

On the other hand, the electron auxiliary layer 276 may be formed through a vacuum evaporation process. The electron auxiliary layer 276 may be formed substantially over the entire surface of the substrate 200 and may be disposed all in the emission area EA, the first transparent area TA1 and the second transparent area TA2 of the pixel region P. However, the electron auxiliary layer 276 may be removed in the first transparent area TA1. Alternatively, the electron auxiliary layer 276 may be formed through a solution process. In this case, the electron auxiliary layer 276 may be disposed in the emission area EA and the second transparent area TA2 and cannot be disposed in the first transparent area TA1 of the pixel region P.

A second electrode 280 of a conductive material having a relatively low work function is formed on the light-emitting layer 270 substantially over the entire surface of the substrate 200. The second electrode 280 may be formed of aluminum (Al), magnesium (Mg), silver (Ag), or an alloy thereof. The second electrode 280 has a relatively thin thickness such that light from the light-emitting layer 270 may be transmitted therethrough. Alternatively, the second electrode 280 may be formed of a transparent conductive material such as indium-gallium-oxide (IGO).

The first electrode 260, the light-emitting layer 270 and the second electrode 280 constitute a light-emitting diode De. The first electrode 260 may serve as an anode, and the second electrode 280 may serve as a cathode. As described above, the transparent display device according to the third example embodiment of the present disclosure may be a top emission type in which light from the light-emitting layer 270 of the light-emitting diode De is output toward a direction opposite to the substrate 200, that is, output to the outside through the second electrode 280. The top emission type display device may have a wider emission area than a bottom emission type display device of the same size, so that the luminance may be improved and the power consumption may be reduced.

The light-emitting diode De of each pixel region P may have an element thickness for a micro-cavity effect corresponding to a wavelength of the emitted light, thereby increasing the light efficiency. A protective layer and/or an encapsulating layer (not shown) may be formed on the second electrode 280 substantially over the entire surface of the substrate 200 to block moisture or oxygen introduced from the outside, thereby protecting the light-emitting diode De. In the transparent display device according to the third example embodiment of the present disclosure, the pixel region P includes the emission area EA, the first transparent area TA1 and the second transparent area TA2. In this way, the surrounding environment information such as backgrounds may be shown together through the first and second transparent areas TA1 and TA2 while displaying the image information through the emission area EA.

The second transparent area TA2 is provided at both sides of the emission area EA, and the hole auxiliary layer 272 and the light-emitting material layer 274 are formed in the second transparent areas TA2 as well as in the emission areas EA through the solution process. As such, the number of corresponding nozzles for forming the layers may be increased. Therefore, the number of scanning steps may be decreased, and the processing time required for scanning may be reduced.

Because the hole auxiliary layer 272 and the light-emitting material layer 274 formed in the second transparent area TA2 are transparent, the transmittance of the transparent display device including the first and second transparent areas TA1 and TA2 according to the third example embodiment is not significantly lowered as compared with the transparent display device including only the transparent area TA according to the second example embodiment.

Figure 10:
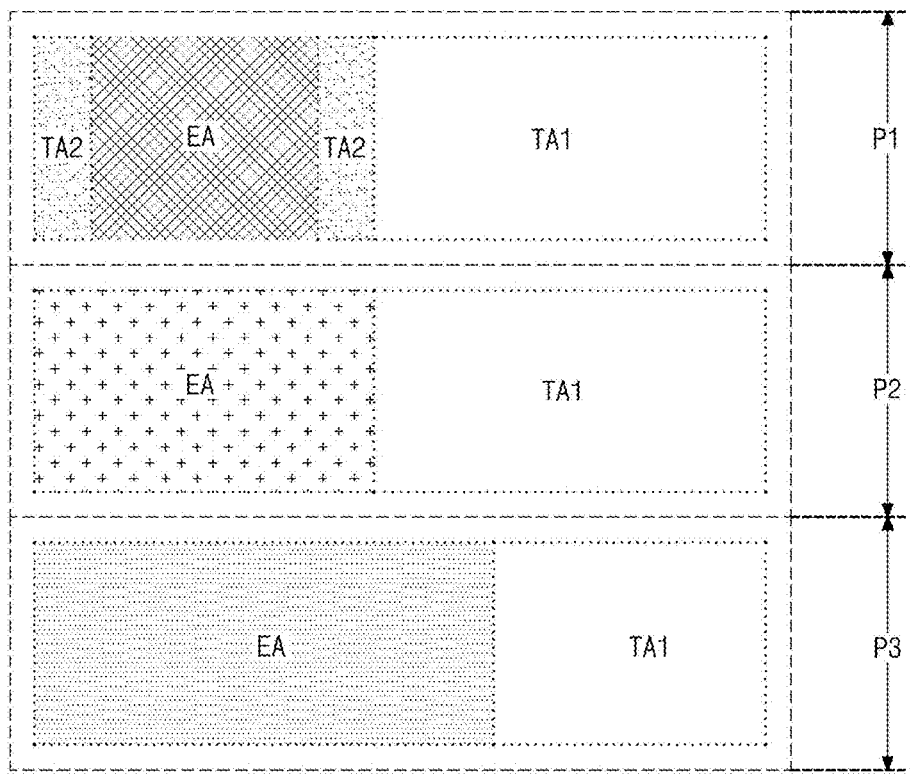
FIG. 10 illustrates a transparent display device according to a fourth example embodiment of the present disclosure.

FIG. 10 illustrates a transparent display device according to a fourth example embodiment of the present disclosure and shows one pixel. In FIG. 10, the transparent display device according to the fourth example embodiment of the present disclosure includes a gate line (not shown) extending in a first direction and data lines (not shown) extending in a second direction. The gate line and the data lines cross each other to thereby define first, second and third pixel regions P1, P2 and P3. The gate line and the data lines may be configured the same as those in the second example embodiment of FIG. 2.

The first, second and third pixel regions P1, P2 and P3 may be sequentially arranged in the first direction. The first, second and third pixel regions P1, P2 and P3 correspond to first, second and third sub-pixels, respectively, and the first, second and third sub-pixels constitute one pixel. However, the pixel may further include one or more sub-pixels. The first pixel region P1 has a different configuration from the second and third pixel regions P2 and P3. For example, the first pixel region P1 includes an emission area EA and a transparent area TA1 and TA2 arranged in the second direction. The transparent area TA1 and TA2 includes a first transparent area TA1 and a second transparent area TA2, and the first and second transparent areas TA1 and TA2 have different transmittances. In addition, the second transparent area TA2 is divided into a first portion and a second portion. The first portion of the second transparent area TA2 may be disposed between the emission area EA and the first transparent area TA1, and the emission area EA may be disposed between the first portion and the second portion of the second transparent area TA2.

Alternatively, each of the second and third pixel regions P2 and P3 includes an emission area EA and a transparent area, that is, a first transparent area TA1 arranged in the second direction. The transmittance of the second transparent area TA2 may be higher than the transmittance of the first transparent area TA1. Alternatively, the transmittance of the first transparent area TA1 may be higher than the transmittance of the second transparent area TA2. A light-emitting diode (not shown) is disposed in each of the emission areas EA of the first, second and third pixel regions P1, P2 and P3. In addition, at least one thin film transistor and at least one capacitor are disposed in each of the emission areas EA of the first, second and third pixel regions P1, P2 and P3.

The emission areas EA of the first, second and third pixel regions P1, P2 and P3 emit light of different colors. For example, the emission areas EA of the first, second and third pixel regions P1, P2 and P3 may emit light of red, green and blue, respectively. In addition, at least one transparent layer (not shown) transmitting light may be disposed in each of the first transparent areas TA1 of the first, second and third pixel regions P1, P2 and P3 and the second transparent area TA2 of the first pixel region P1. A type and/or number of layers disposed in the first and second transparent areas TA1 and TA2 are different from each other.

The emission areas EA of the first, second and third pixel regions P1, P2 and P3 have different areas. For example, the area of the emission area EA of the second pixel region P2 may be larger than the area of the emission area EA of the first pixel region P1 and smaller than the area of the emission area EA of the third pixel region P3. For example, the area ratio of the emission areas EA of the first, second and third pixel regions P1, P2 and P3 may be 1:1.5:2. The area ratio of the emission areas EA of the first, second and third pixel regions P1, P2 and P3 may be determined based on the lifetimes of the light-emitting diodes provided in the respective emission areas EA and may be varied.

The emission areas EA of the first, second and third pixel regions P1, P2 and P3 may have the same width along the first direction and different lengths along the second direction. For example, the length of the emission area EA of the second pixel region P2 may be larger than the length of the emission area EA of the first pixel region P1 and smaller than the length of the emission area EA of the third pixel region P3. The lengths of the emission areas EA of the first, second and third pixel regions P1, P2 and P3 may have the ratio of 1:1.5:2. The length of the emission area EA of the first pixel region P1 may be equal to or larger than the width of the emission area EA of the first pixel region P1.

The transparent areas of the first, second and third pixel regions P1, P2 and P3 may also have different total areas. The total area of the transparent area means the sum of the areas of the first transparent area TA1 and the second transparent area TA2 in each pixel region P1, P2 and P3. For example, the total area of the transparent area of the second pixel region P2, that is, the area of the first transparent area TA1 of the second pixel region P2, is smaller than the total area of the transparent area of the first pixel region P1, that is, the sum of the areas of the first and second transparent areas TA1 and TA2 of the first pixel region P1. Also, the total area of the transparent area of the second pixel region P2 is larger than the total area of the transparent area of the third pixel region P3, that is, the area of the first transparent area TA1 of the third pixel region P3. For example, the total areas of the transparent areas of the first, second and third pixel regions P1, P2 and P3 may have the ratio of 2:1.5:1.

In addition, the area of the first transparent area TA1 of the second pixel region P2 may be equal to the area of the emission area EA of the second pixel region P2. The total area of the first and second transparent areas TA1 and TA2 of the first pixel region P1 may be larger than the area of the emission area EA of the first pixel region P1. The area of the first transparent area TA1 of the third pixel region P3 may be smaller than the area of the emission area EA of the third pixel region P3. The sum of the areas of the emission area EA and the second transparent area TA2 of the first pixel region P1 may be equal to the area of the emission area EA of the second pixel region P2. Accordingly, the area of the first transparent area TA1 of the first pixel region P1 may be equal to the area of the first transparent area TA1 of the second pixel region P2.

The total area of the second transparent area TA2 of the first pixel region P1 may be smaller than the area of the first transparent area TA1 of the first pixel region P1 and may be smaller than or equal to the area of the emission area EA of the first pixel region P1. The total area of the second transparent area TA2 of the first pixel region P1 may be ½ to 1 times the area of the emission area EA of the first pixel region P1.

In the transparent display device according to the fourth example embodiment of the present disclosure, the first, second and third pixel regions P1, P2 and P3 may have the same area. As described above, in the transparent display device according to the fourth example embodiment of the present disclosure, the second transparent area TA2 is provided only in the first pixel region P1, which includes the emission area EA having the shortest length. As such, the number of corresponding nozzles for forming the light-emitting layer of the first pixel region P1 may be increased. Therefore, the number of scanning steps may be decreased, and the processing time required for scanning may be reduced. In the transparent display device according to the fourth example embodiment of the present disclosure, when the transmittance of the second transparent area TA2 is lower than the transmittance of the first transparent TA1, the transmittance of the display device may be increased because the area of the second transparent area TA2 formed in one pixel may be decreased as compared with the third example embodiment.

In the fourth example embodiment of the present disclosure, only the first pixel region P1 may include the second transparent area TA2. However, alternatively, each of the first and second pixel regions P1 and P2 may include the emission area EA and the first and second transparent areas TA1 and TA2, and the third pixel region P3 may include the emission area EA and the first transparent area TA1. The pixel configuration of the transparent display device according to the fourth example embodiment of the present disclosure may be implemented by a bank, as illustrated in the following figures.

Figure 11:
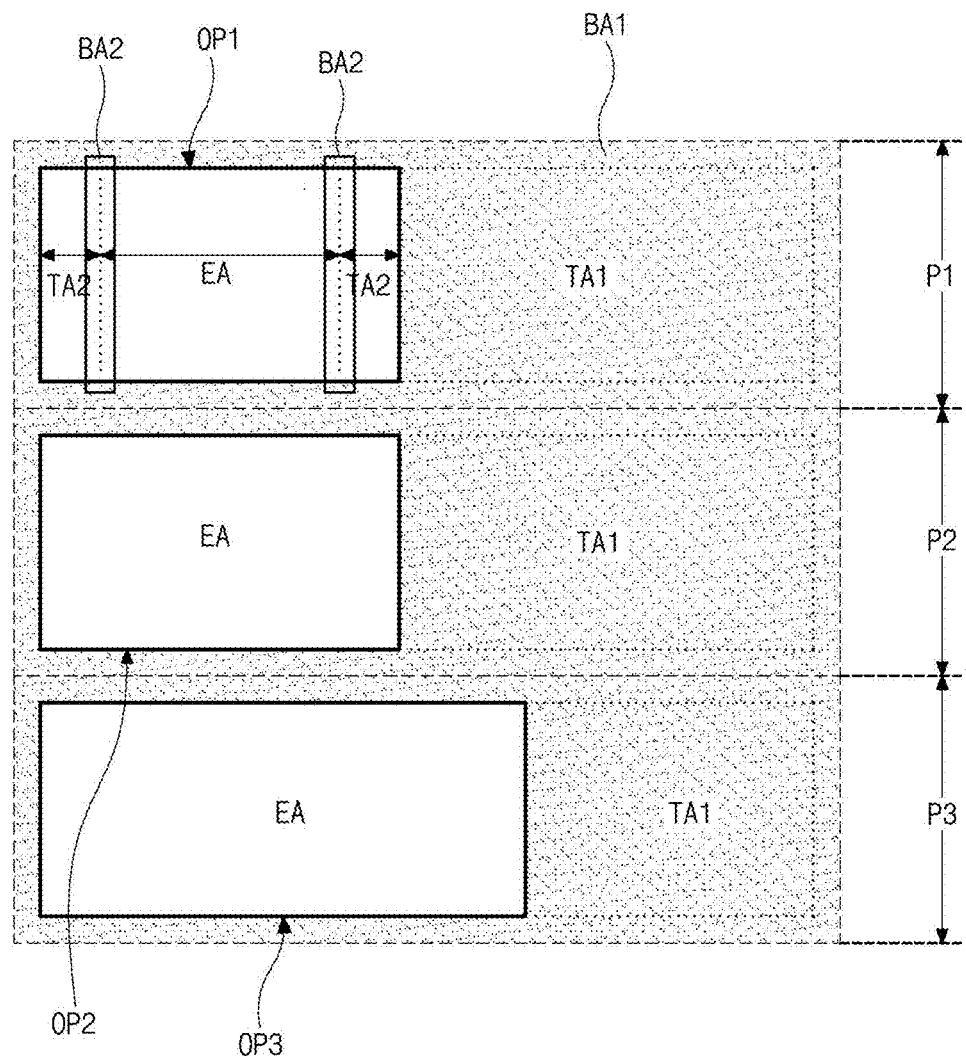
FIG. 11 illustrates a bank of a transparent display device according to the fourth example embodiment of the present disclosure.

FIG. 11 illustrates a bank of a transparent display device according to the fourth example embodiment of the present disclosure. In FIG. 11, a first bank BA1 is formed substantially on an entire surface of a substrate (not shown), and the first bank BA1 has first, second and third openings OP1, OP2 and OP3 in first, second and third pixel regions P1, P2 and P3, respectively. The first opening OP1 corresponds to the emission area EA and the second transparent area TA2 of the first pixel region P1, the second opening OP2 corresponds to the emission area EA of the second pixel region P2, and the third opening OP3 corresponds to the emission area EA of the third pixel region P3. The first and second openings OP1 and OP2 may have the same size and smaller than the third opening OP3. Alternatively, the first opening OP1 may be larger than the second opening OP2 and smaller than the third opening OP3.

In addition, a second bank BA2 is formed corresponding to a border between the emission area EA and the second transparent area TA2 of the first pixel region P1. The second bank BA2 may be configured in an island shape. Although not shown in FIG. 11, a light-emitting diode including a first electrode, a light-emitting layer and a second electrode may be provided corresponding to each of the emission areas EA of the first, second and third pixel regions P1, P2 and P3. The light-emitting diode emits light through each of the first, second and third openings OP1, OP2 and OP3.

Although the first, second and third openings OP1, OP2 and OP3 are shown as having a tetragonal shape with angled corners, the shape of the first, second and third openings OP1, OP2 and OP3 is not limited thereto. Alternatively, the first, second and third openings OP1, OP2 and OP3 may have a tetragonal shape with rounded corners or may have a circular shape, an oval shape or a polygonal shape other than the tetragonal shape.

In the transparent display device according to the fourth example embodiment of the present disclosure, the first pixel region P1 has the same structure as the pixel region of the transparent display device according to the third example embodiment. Also, each of the second and third pixel regions P2 and P3 has the same structure as the pixel region of the transparent display device according to the second example embodiment. Namely, in the transparent display device according to the fourth example embodiment of the present disclosure, the first pixel region P1 has the cross-sectional structure of FIG. 9, and each of the second and third pixel regions P2 and P3 has the cross-sectional structure of FIG. 5. In addition, the emission area EA of each pixel region P1, P2 and P3 may have the same structure as that of FIG. 4.

Figure 12:
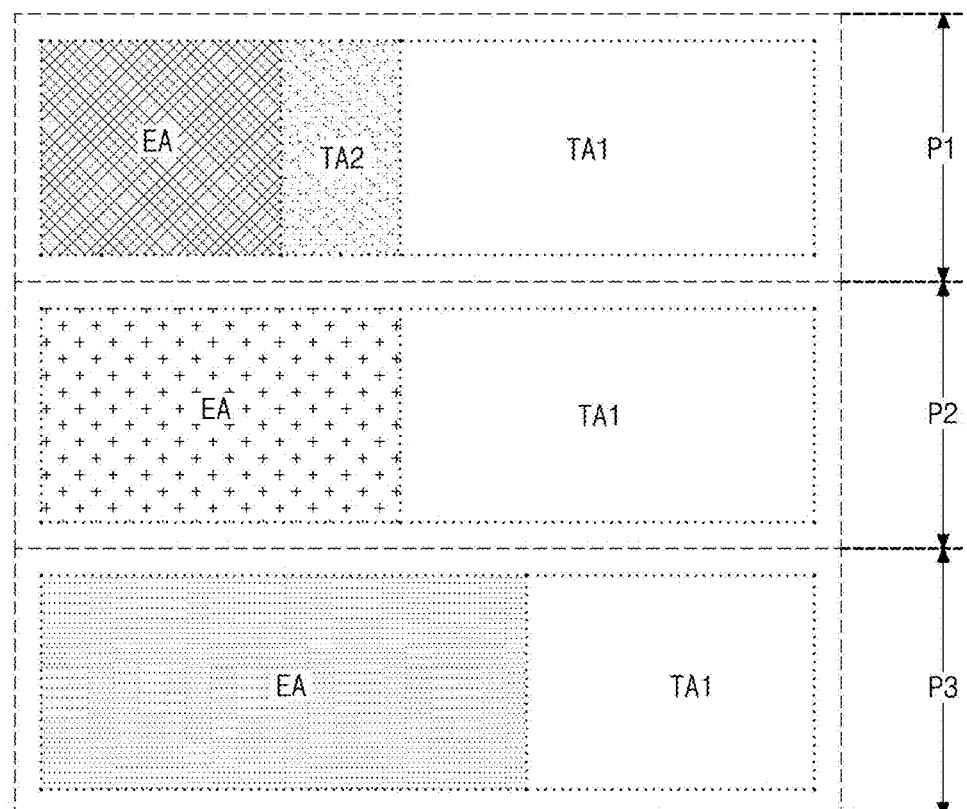
FIG. 12 illustrates a transparent display device according to a fifth example embodiment of the present disclosure.

FIG. 12 illustrates a transparent display device according to a fifth example embodiment of the present disclosure and shows one pixel. In FIG. 12, the transparent display device according to the fifth example embodiment of the present disclosure includes a gate line (not shown) extending in a first direction and data lines (not shown) extending in a second direction. The gate line and the data lines cross each other to thereby define first, second and third pixel regions P1, P2 and P3. The gate line and the data lines may be configured the same as those in the second example embodiment of FIG. 2.

The first, second and third pixel regions P1, P2 and P3 may be sequentially arranged in the first direction. However, the arrangement order of the first, second and third pixel regions P1, P2 and P3 is not limited thereto. The first, second and third pixel regions P1, P2 and P3 correspond to first, second and third sub-pixels, respectively, and the first, second and third sub-pixels constitute one pixel. However, the pixel may further include one or more sub-pixels.

The first pixel region P1 has a different configuration from the second and third pixel regions P2 and P3. For example, the first pixel region P1 includes an emission area EA and a transparent area TA1 and TA2 arranged in the second direction. The transparent area TA1 and TA2 includes a first transparent area TA1 and a second transparent area TA2, and the first and second transparent areas TA1 and TA2 have different transmittances. The second transparent area TA2 is disposed between the emission area EA and the first transparent area TA1.

Alternatively, each of the second and third pixel regions P2 and P3 may include an emission area EA and a transparent area, that is, a first transparent area TA1 arranged in the second direction. The transmittance of the second transparent area TA2 may be higher than the transmittance of the first transparent area TA1. Alternatively, the transmittance of the first transparent area TA1 may be higher than the transmittance of the second transparent area TA2.

A light-emitting diode (not shown in FIG. 12) is disposed in each of the emission areas EA of the first, second and third pixel regions P1, P2 and P3. Further, at least one thin film transistor and at least one capacitor are disposed in each of the emission areas EA of the first, second and third pixel regions P1, P2 and P3. The emission areas EA of the first, second and third pixel regions P1, P2 and P3 may emit light of different colors. For example, the emission areas EA of the first, second and third pixel regions P1, P2 and P3 may emit light of red, green and blue, respectively. In addition, at least one transparent layer (not shown) transmitting light may be disposed in each of the first transparent areas TA1 of the first, second and third pixel regions P1, P2 and P3 and the second transparent area TA2 of the first pixel region P1. A type and/or number of layers disposed in the first and second transparent areas TA1 and TA2 may be different from each other.

The emission areas EA of the first, second and third pixel regions P1, P2 and P3 may have different areas. For example, the area of the emission area EA of the second pixel region P2 may be larger than the area of the emission area EA of the first pixel region P1 and smaller than the area of the emission area EA of the third pixel region P3. For example, the area ratio of the emission areas EA of the first, second and third pixel regions P1, P2 and P3 may be 1:1.5:2. The area ratio of the emission areas EA of the first, second and third pixel regions P1, P2 and P3 may be determined based on the lifetimes of the light-emitting diodes provided in the respective emission areas EA and may be varied.

The emission areas EA of the first, second and third pixel regions P1, P2 and P3 may have the same width along the first direction and different lengths along the second direction. For example, the length of the emission area EA of the second pixel region P2 may be larger than the length of the emission area EA of the first pixel region P1 and smaller than the length of the emission area EA of the third pixel region P3. The lengths of the emission areas EA of the first, second and third pixel regions P1, P2 and P3 may have the ratio of 1:1.5:2. The length of the emission area EA of the first pixel region P1 may be equal to or larger than the width of the emission area EA of the first pixel region P1.

The transparent areas of the first, second and third pixel regions P1, P2 and P3 may also have different total areas. The total area of the transparent area means the sum of the areas of the first transparent area TA1 and the second transparent area TA2 in each pixel region P1, P2 and P3. For example, the total area of the transparent area of the second pixel region P2, that is, the area of the first transparent area TA1 of the second pixel region P2, is smaller than the total area of the transparent area of the first pixel region P1, that is, the sum of the areas of the first and second transparent areas TA1 and TA2 of the first pixel region P1. The total area of the transparent area of the second pixel region P2 may be larger than the total area of the transparent area of the third pixel region P3, that is, the area of the first transparent area TA1 of the third pixel region P3. For example, the total areas of the transparent areas of the first, second and third pixel regions P1, P2 and P3 may have the ratio of 2:1.5:1.

In addition, the area of the first transparent area TA1 of the second pixel region P2 may be equal to the area of the emission area EA of the second pixel region P2. The total area of the first and second transparent areas TA1 and TA2 of the first pixel region P1 may be larger than the area of the emission area EA of the first pixel region P1. The area of the first transparent area TA1 of the third pixel region P3 may be smaller than the area of the emission area EA of the third pixel region P3.

The sum of the areas of the emission area EA and the second transparent area TA2 of the first pixel region P1 may be equal to the area of the emission area EA of the second pixel region P2. Accordingly, the area of the first transparent area TA1 of the first pixel region P1 may be equal to the area of the first transparent area TA1 of the second pixel region P2. The area of the second transparent area TA2 of the first pixel region P1 may be smaller than the area of the first transparent area TA1 of the first pixel region P1 and may be smaller than or equal to the area of the emission area EA of the first pixel region P1. The area of the second transparent area TA2 of the first pixel region P1 may be ½ to 1 times the area of the emission area EA of the first pixel region P1.

In the transparent display device according to the fifth example embodiment of the present disclosure, the first, second and third pixel regions P1, P2 and P3 may have the same area. As described above, in the transparent display device according to the fifth example embodiment of the present disclosure, the second transparent area TA2 is provided only in the first pixel region P1, which includes the emission area EA having the shortest length. As such, the number of corresponding nozzles for forming the light-emitting layer of the first pixel region P1 may be increased. Therefore, the number of scanning steps may be decreased, and the processing time required for scanning may be reduced.

In the transparent display device according to the fifth example embodiment of the present disclosure, when the transmittance of the second transparent area TA2 is lower than the transmittance of the first transparent TA1, the transmittance of the display device may be increased. This is because the area of the second transparent area TA2 formed in one pixel may be decreased as compared with the third example embodiment. In the fifth example embodiment of the present disclosure, it is described that only the first pixel region P1 includes the second transparent area TA2. Alternatively, each of the first and second pixel regions P1 and P2 may include the emission area EA and the first and second transparent areas TA1 and TA2, and the third pixel region P3 may include the emission area EA and the first transparent area TA1. The pixel configuration of the transparent display device according to the fifth example embodiment of the present disclosure may be implemented by a bank, as illustrated in the following figures.

Figure 13:
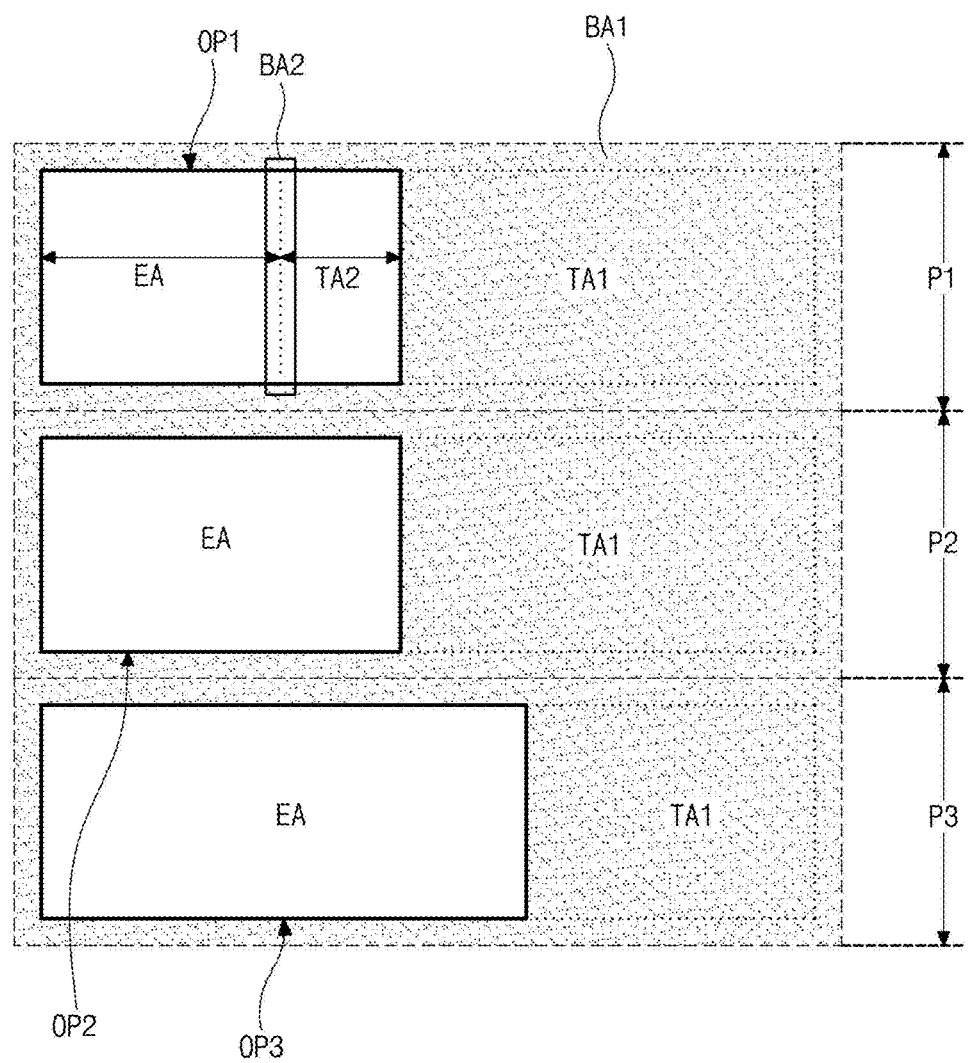
FIG. 13 illustrates a bank of a transparent display device according to the fifth example embodiment of the present disclosure.

FIG. 13 illustrates a bank of a transparent display device according to the fifth example embodiment of the present disclosure. In FIG. 13, a first bank BA1 may be formed substantially on an entire surface of a substrate (not shown), and the first bank BA1 has first, second and third openings OP1, OP2 and OP3 in first, second and third pixel regions P1, P2 and P3, respectively. The first opening OP1 corresponds to the emission area EA and the second transparent area TA2 of the first pixel region P1, the second opening OP2 corresponds to the emission area EA of the second pixel region P2, and the third opening OP3 corresponds to the emission area EA of the third pixel region P3. The first and second openings OP1 and OP2 may have the same size and smaller than the third opening OP3. Alternatively, the first opening OP1 may be larger than the second opening OP2 and smaller than the third opening OP3.

In addition, a second bank BA2 is formed corresponding to a border between the emission area EA and the second transparent area TA2 of the first pixel region P1. The second bank BA2 may be configured in an island shape. Although not shown in FIG. 13, a light-emitting diode including a first electrode, a light-emitting layer and a second electrode may be provided corresponding to each of the emission areas EA of the first, second and third pixel regions P1, P2 and P3. The light-emitting diode emits light through each of the first, second and third openings OP1, OP2 and OP3.

Although the first, second and third openings OP1, OP2 and OP3 are shown as having a tetragonal shape with angled corners, the shape of the first, second and third openings OP1, OP2 and OP3 is not limited thereto. Alternatively, the first, second and third openings OP1, OP2 and OP3 may have a tetragonal shape with rounded corners or may have a circular shape, an oval shape or a polygonal shape other than the tetragonal shape. The cross-sectional structure of the first pixel region P1 of the transparent display device according to the fifth example embodiment of the present disclosure will be described in more detail with reference to FIG. 14.

Figure 14:
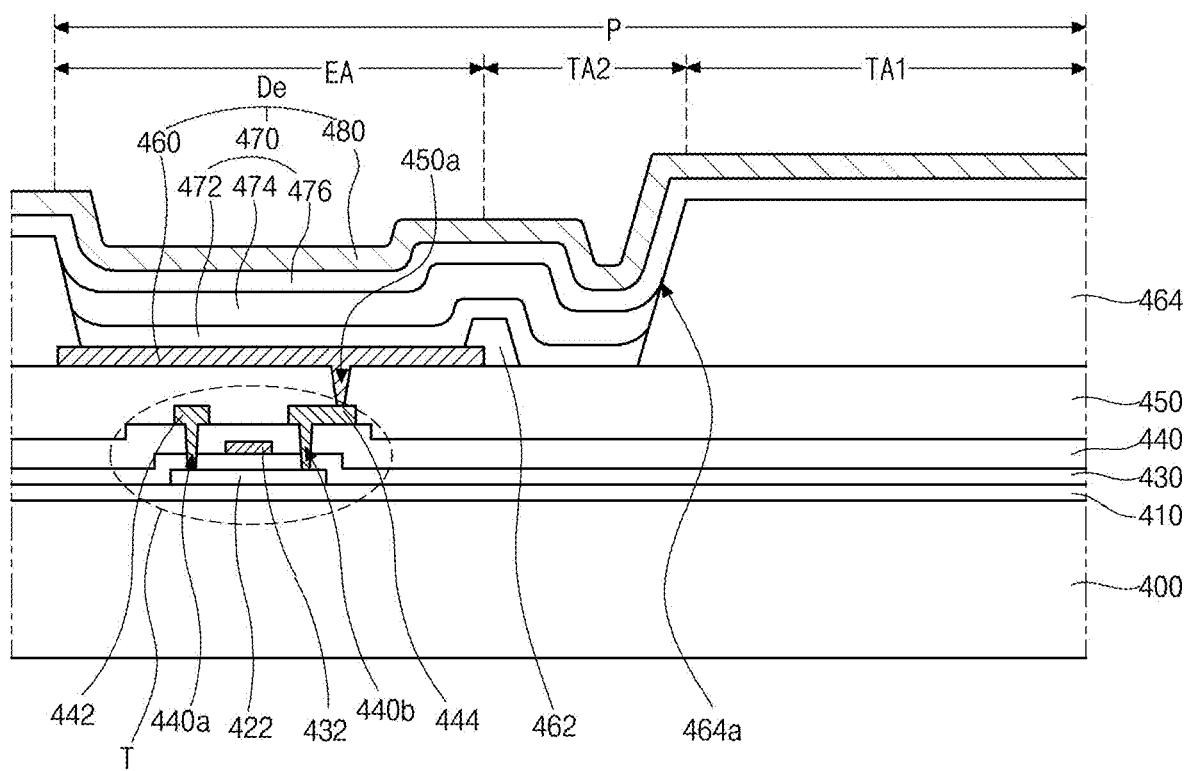
FIG. 14 is a schematic cross-sectional view that illustrates a first pixel region of a transparent display device according to the fifth example embodiment of the present disclosure.

FIG. 14 is a cross-sectional view that illustrates a first pixel region of a transparent display device according to the fifth example embodiment of the present disclosure and has the same structure as that of the third example embodiment except for the bank and the light-emitting diode. The same parts as the third example embodiment will be designated by similar references, and descriptions of the same parts will be omitted or shortened. In FIG. 14, a pixel region P including an emission area EA and a transparent area TA1 and TA2 is defined on a substrate 400. The transparent area TA1 and TA2 includes a first transparent area TA1 and a second transparent area TA2, and the second transparent area TA2 is disposed between the emission area EA and the first transparent area TA1.

A buffer layer 410 is formed on the substrate 400. The buffer layer 410 is disposed substantially on an entire surface of the substrate 400. A patterned semiconductor layer 422 is formed in the emission area EA on the buffer layer 410. A gate insulating layer 430 of an insulating material is formed on the semiconductor layer 422 substantially over the entire surface of the substrate 400.

A gate electrode 432 of a conductive material such as metal is formed on the gate insulating layer 430 corresponding to the center of the semiconductor layer 422. In addition, a gate line (not shown) and a first capacitor electrode (not shown) may be formed on the gate insulating layer 430. An interlayer insulating layer 440 made of an insulating material is formed on the gate electrode 432 substantially over the entire surface of the substrate 400. The interlayer insulating layer 440 has first and second contact holes 440a and 440b exposing top surfaces of both ends of the semiconductor layer 422. The first and second contact holes 440a and 440b are disposed at both sides of the gate electrode 432 and spaced apart from the gate electrode 432.

Source and drain electrodes 442 and 444 of a conductive material such as metal are formed on the interlayer insulating layer 440. In addition, a data line (not shown), a power supply line (not shown) and a second capacitor electrode (not shown) may be further formed on the interlayer insulating layer 440. The source and drain electrodes 442 and 444 are spaced apart from each other with the gate electrode 432 positioned therebetween and are in contact with the both ends of the semiconductor layer 422 through the first and second contact holes 440a and 440b, respectively. The semiconductor layer 422, the gate electrode 432, and the source and drain electrodes 442 and 444 form a thin film transistor T. The thin film transistor T has a coplanar structure. Alternatively, the thin film transistor may have an inverted staggered structure, and the semiconductor layer may be formed of oxide semiconductor or amorphous silicon.

A passivation layer 450 of an insulating material is formed on the source and drain electrodes 442 and 444 substantially over the entire surface of the substrate 400. The passivation layer 450 may have a flat top surface, and has a drain contact hole 450a exposing the drain electrode 444. A first electrode 460 is formed on the passivation layer 450 and formed of a conductive material having a relatively high work function. The first electrode 460 is disposed in the emission area EA of the pixel region P and is in contact with the drain electrode 444 through the drain contact hole 450a. The first electrode 460 is not formed in the first transparent area TA1 and the second transparent area TA2.

A lower bank 462 of an insulating material is formed on the first electrode 460 and the passivation layer 450. The lower bank 462 corresponds to a border the emission area EA and the second transparent area TA2 and covers an edge of the first electrode 460. The lower bank 462 may be formed of a material having a hydrophilic property, for example, an inorganic insulating material such as silicon oxide ($SiO_2$) or silicon nitride (SiNx). Alternatively, the lower bank 462 may be formed of polyimide.

An upper bank 464 of an insulating material is formed on the passivation layer 450. A thickness of the upper bank 464 is thicker than that of the lower bank 462. The upper bank 464 may be formed of an organic insulating material having a hydrophobic property. The upper bank 464 has an opening 464a exposing the first electrode 460 and the lower bank 462 corresponding to the emission area EA and the second transparent area TA2. The upper bank 464 is spaced apart from one end of the first electrode 460 and covers an opposite end of the first electrode 460. A top surface of the passivation layer 450 corresponding to the second transparent area TA2 may be exposed through the opening 464a. The upper bank 464 may have a transmissive hole (not shown) corresponding to the first transparent area TA1. In this case, the upper surface of the passivation layer 450 corresponding to the first transparent area TA1 may be exposed through the transmissive hole.

A light-emitting layer 470 is formed on the first electrode 460, the lower bank 462 and the passivation layer 450 exposed through the opening 464a of the upper bank 464. The light-emitting layer 470 may include a first charge auxiliary layer 472, a light-emitting material layer 474, and a second charge auxiliary layer 476 sequentially positioned over the first electrode 460. The light-emitting material layer 474 may be formed of any one of red, green and blue luminescent materials. The luminescent material may be an organic luminescent material such as a phosphorescent compound or a fluorescent compound or may be an inorganic luminescent material such as a quantum dot.

The first charge auxiliary layer 472 may be a hole auxiliary layer, and the hole auxiliary layer 472 may include at least one of a hole injecting layer (HIL) and a hole transporting layer (HTL). In addition, the second charge auxiliary layer 476 may be an electron auxiliary layer, and the electron auxiliary layer 476 may include at least one of an electron injecting layer (EIL) and an electron transporting layer (ETL). Alternatively, the first charge auxiliary layer 472 may be an electron auxiliary layer, and the second charge auxiliary layer 476 may be a hole auxiliary layer.

The hole auxiliary layer 472 and the light-emitting material layer 474 may be formed through a solution process. When the solution is dried, a drying speed of a solvent in a region adjacent to the upper bank 464 is different from that in other regions. Therefore, heights of the hole auxiliary layer 472 and the light-emitting material layer 474 in the region adjacent to the upper bank 464 may rise as it gets closer to the upper bank 464. The hole auxiliary layer 472 and the light-emitting material layer 474 are disposed in the emission area EA and the second transparent area TA2 of the pixel region P and are not disposed in the first transparent area TA1.

The electron auxiliary layer 476 may be formed through a vacuum evaporation process. The electron auxiliary layer 476 may be formed substantially over the entire surface of the substrate 400 and may be disposed all in the emission area EA, the first transparent area TA1 and the second transparent area TA2 of the pixel region P. However, the electron auxiliary layer 476 may be removed in the first transparent area TA1. Alternatively, the electron auxiliary layer 476 may be formed through a solution process. The electron auxiliary layer 476 may be disposed in the emission area EA and the second transparent area TA2 and cannot be disposed in the first transparent area TA1 of the pixel region P.

A second electrode 480 of a conductive material having a relatively low work function is formed on the light-emitting layer 470 substantially over the entire surface of the substrate 400. The second electrode 480 may be formed of aluminum (Al), magnesium (Mg), silver (Ag), or an alloy thereof. The second electrode 480 may have a relatively thin thickness such that light from the light-emitting layer 470 may be transmitted therethrough. Alternatively, the second electrode 480 may be formed of a transparent conductive material such as indium-gallium-oxide (IGO). The first electrode 460, the light-emitting layer 470 and the second electrode 480 constitute a light-emitting diode De. The first electrode 460 may serve as an anode, and the second electrode 480 may serve as a cathode. A protective layer and/or an encapsulating layer (not shown) may be formed on the second electrode 480 substantially over the entire surface of the substrate 400 to block moisture or oxygen introduced from the outside, thereby protecting the light-emitting diode De.

In the transparent display device according to the fifth example embodiment of the present disclosure, each of the second and third pixel regions P2 and P3 of FIG. 12 has the same structure as the pixel region of the transparent display device according to the second example embodiment. Namely, in the transparent display device according to the fifth example embodiment of the present disclosure, each of the second and third pixel regions P2 and P3 has the cross-sectional structure of FIG. 5. Further, in the transparent display device according to the fifth example embodiment of the present disclosure, the emission area EA of each pixel region P1, P2 and P3 of FIG. 12 may have the same structure as that of FIG. 4. As described above, in the transparent display device according to the fifth example embodiment of the present disclosure, the second transparent area TA2 may be provided only between the emission area EA and the first transparent area TA1 of the first pixel region P1.

In the above example embodiments, although the transparent areas of the first, second and third pixel regions of one pixel are described as being separated from each other, the transparent areas of the first, second and third pixel regions may be connected to each other such that substantially one transparent area may be provided in one pixel. The transparent area may have different sizes corresponding to the first, second and third pixel regions, respectively. In the present disclosure, each of the first, second and third pixel regions may include the emission area and the transparent area, so that the surrounding environment information such as backgrounds may be shown together through the transparent area while displaying the image information through the emission area.

In addition, the areas of the emission areas of the first, second and third pixel regions are made different from each other, and it is possible to optimize the lifetimes of the light-emitting diodes of the first, second and third pixel regions, thereby increasing the lifetime of the transparent display device. Further, the widths of the emission areas of the first, second and third pixel regions are the same, and the lengths of the emission areas of the first, second and third pixel regions are equal to or larger than the widths of the emission areas. Accordingly, the light-emitting layers of the light-emitting diodes may be formed through the solution process using the features of the present disclosure, and the manufacturing cost may be decreased.

Moreover, at least one of the transparent areas of the first, second and third pixel regions includes the first and second transparent areas having different transmittances. The light-emitting layer may be formed in the second transparent area as well as in the emission area through the solution process. As such, the number of corresponding nozzles for forming the light-emitting layers may be increased. Therefore, the number of scanning steps may be decreased, and the processing time required for scanning may be reduced.

It will be apparent to those skilled in the art that various modifications and variations may be made in a transparent display device of the present disclosure without departing from the sprit or scope of the example embodiments. Thus, it is intended that the present disclosure covers the modifications and variations of this invention provided they come within the scope of the appended claims and their equivalents.

What is claimed is:

1. A transparent display device, comprising:
a substrate including an emission area and a first transparent area;
first, second, and third pixel regions on the substrate and including the emission area and the first transparent area; a first bank on the substrate; a first opening surrounded by the first bank and corresponding to the first pixel region; a second opening surrounded by the first bank and corresponding to the second pixel region; a third opening surrounded by the first bank and corresponding to the third pixel region; a plurality of second banks overlapping at least one of the first, second, and third openings, and overlapping the first bank; and a light-emitting diode on the first, second, and third openings on the substrate, wherein the emission area of the second pixel region is larger than the emission area of the first pixel region and smaller than the emission area of the third pixel region, and wherein the first transparent area of the third pixel region is smaller than each of the first transparent area of the first pixel region and the first transparent area of the second pixel region.

2. The transparent display device of claim 1, wherein the emission areas of the first, second, and third pixel regions have different sizes of areas, and the first transparent areas of the first, second, and third pixel regions have different sizes of areas.

3. The transparent display device of claim 1, wherein the emission area of the second pixel region is larger than the emission area of the first pixel region and smaller than the emission area of the third pixel region, and wherein the first transparent area of the second pixel region is smaller than the first transparent area of the first pixel region and larger than the first transparent area of the third pixel region.

4. The transparent display device of claim 1, wherein the light-emitting diode includes a first electrode, a light-emitting layer, and a second electrode.

5. The transparent display device of claim 1, wherein the first bank has a transmissive hole corresponding to the first transparent area.

6. The transparent display device of claim 1, wherein the first, second, and third openings include the emission area and a second transparent area.

7. The transparent display device of claim 6, wherein the second electrode is on the emission area and first transparent area.

8. The transparent display device of claim 7, wherein the portion of the second electrode on the first transparent area is higher than the portion of the second electrode on the emission area.

9. The transparent display device of claim 6, wherein the plurality of second banks corresponds to a border between the emission area and the second transparent area of the first pixel region.

10. The transparent display device of claim 6, wherein the first transparent area of the first pixel region is larger than the second transparent area of the first pixel region, and the second transparent area of the first pixel region is between the emission area of the first pixel region and the first transparent area of the first pixel region.

11. The transparent display device of claim 6, wherein the light-emitting diode is on the emission area and the second transparent area.

12. The transparent display device of claim 1, wherein the second banks of the plurality of second banks are separated from each other by a first distance in the first pixel region, a second distance in the second pixel region, and a third distance in the third pixel region.

13. The transparent display device of claim 12, wherein the first, second, and third distances are different from each other.

14. The transparent display device of claim 13, wherein the third distance is greater than the second distance, and the second distance is greater than the first distance.

15. The transparent display device of claim 1, wherein the plurality of second banks includes portions overlapping the first bank between the first, second, and third pixel regions.

16. The transparent display device of claim 15, wherein the portions overlapping the first bank between the first and second pixel regions are separated from each other by a first distance, and the portions overlapping the first bank between the second and third pixel regions are separated from each other by a second distance that is different from the first distance.

17. The transparent display device of claim 16, wherein the second distance is greater than the first distance.

18. The transparent display device of claim 15, wherein the portions overlapping the first bank between the first, second, and third pixel regions have different sizes.

19. The transparent display device of claim 18, wherein the portions overlapping the first bank between the first, second, and third pixel regions have different lengths in a first direction.

20. The transparent display device of claim 19, wherein the portions overlapping the first bank between the first, second, and third pixel regions have the same widths in a second direction.

21. The transparent display device of claim 1, wherein the first bank has a first height, and the plurality of second banks has a second height that is different from the first bank.

22. The transparent display device of claim 21, wherein the second height of the plurality of second banks is smaller than the first height of the first bank.

23. The transparent display device of claim 1, wherein the first bank has a hydrophobic property, and the plurality of second banks has a hydrophilic property.

\* \* \* \* \*